(12) United States Patent
Kuon et al.

(10) Patent No.: US 11,316,139 B2
(45) Date of Patent: Apr. 26, 2022

(54) DISPLAY APPARATUS, STRUCTURE AND MANUFACTURING APPARATUS OF FLEXIBLE DISPLAY APPARATUS

(71) Applicant: LG Display Co., Ltd., Seoul (KR)

(72) Inventors: IkHyun Kuon, Paju-si (KR); Yongsoo Kim, Paju-si (KR); SangEun Han, Paju-si (KR); SungNam Byun, Paju-si (KR); JeongKweon Park, Paju-si (KR); SangGul Lee, Paju-si (KR); Changmin Pyo, Paju-si (KR); Doowon Seo, Paju-si (KR); Bogyung Kang, Paju-si (KR); Sungwook Park, Paju-si (KR); Juyeob Lee, Paju-si (KR); YongMin Ha, Paju-si (KR); SoonBum Shin, Paju-si (KR); MoonGoo Kim, Paju-si (KR); Chan Park, Paju-si (KR); YunMi Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 141 days.

(21) Appl. No.: 16/709,569

(22) Filed: Dec. 10, 2019

(65) Prior Publication Data

US 2020/0203672 A1    Jun. 25, 2020

(30) Foreign Application Priority Data

Dec. 21, 2018    (KR) .................. 10-2018-0167954

(51) Int. Cl.
*H01L 27/32* (2006.01)
*H01L 51/52* (2006.01)
(Continued)

(52) U.S. Cl.
CPC ............ *H01L 51/56* (2013.01); *G06F 1/1609* (2013.01); *G06F 1/1652* (2013.01); *H01L 51/0097* (2013.01); *H01L 51/5246* (2013.01)

(58) Field of Classification Search
CPC ............ H01L 2251/5338; H01L 27/32; H01L 51/1652; H01L 51/5246; H01L 51/56;
(Continued)

(56) References Cited

U.S. PATENT DOCUMENTS 9,446,569 B2    9/2016    Lee et al.
10,194,538 B2   1/2019    Lee et al.
(Continued)

FOREIGN PATENT DOCUMENTS

CN    105398181 A    3/2016
CN    106097893 A    11/2016
(Continued)

OTHER PUBLICATIONS

China National Intellectual Property Administration, Office Action, CN Patent Application No. 201911227324.8, dated Jun. 28, 2021, 24 pages.

*Primary Examiner* — Caridad Everhart
(74) *Attorney, Agent, or Firm* — Fenwick & West LLP

(57) ABSTRACT

A manufacturing apparatus is configured to bond a display panel to a cover window having a flat portion between a first curvature portion and a second curvature portion. The manufacturing apparatus comprises a first attachment portion configured to press a first adhesive surface of the display panel to the flat portion of the cover window, and a 3D attachment portion configured to press a first edge adhesive surface and a second edge adhesive surface of the display panel to the first curvature portion and the second curvature portion of the window, respectively, and not press the first adhesive surface of the display panel.

21 Claims, 12 Drawing Sheets

(51) Int. Cl.
*G09F 9/30* (2006.01)
*H01L 51/56* (2006.01)
*G06F 1/16* (2006.01)
*H01L 51/00* (2006.01)

(58) Field of Classification Search
CPC ............. Y02E 10/549; G02F 1/133305; G02F 1/133331; G02F 1/1302; G02F 1/1341; Y02P 70/50
See application file for complete search history.

(56) References Cited

U.S. PATENT DOCUMENTS

| | | | |
|---|---|---|---|
| 10,315,400 | B2 | 6/2019 | Son et al. |
| 2014/0002973 | A1* | 1/2014 | Lee ........................ G06F 1/1652 361/679.01 |
| 2014/0138009 | A1* | 5/2014 | Lim ........................ H01L 51/56 156/60 |
| 2017/0013731 | A1* | 1/2017 | Lee ........................ H05K 5/0017 |
| 2017/0072671 | A1* | 3/2017 | Son ....................... B32B 38/1866 |
| 2018/0056638 | A1 | 3/2018 | Choi et al. |
| 2018/0086034 | A1 | 3/2018 | Lee et al. |
| 2018/0134022 | A1 | 5/2018 | Kim et al. |
| 2019/0348641 | A1* | 11/2019 | Jung ...................... H01L 51/5246 |
| 2020/0009803 | A1* | 1/2020 | Kang ....................... B29C 65/48 |
| 2020/0152501 | A1* | 5/2020 | Son ...................... H01L 21/67092 |
| 2021/0101819 | A1* | 4/2021 | Yoo ........................ C03B 23/023 |

FOREIGN PATENT DOCUMENTS

| | | |
|---|---|---|
| CN | 108597375 A | 9/2018 |
| CN | 108615468 A | 10/2018 |
| CN | 108648621 A | 10/2018 |
| KR | 10-2014-0010919 A | 1/2014 |
| KR | 10-2014-0052714 A | 5/2014 |
| KR | 10-2014-0139295 A | 12/2014 |
| KR | 10-2014-0139361 A | 12/2014 |
| KR | 10-2015-0101167 A | 9/2015 |
| KR | 10-1578442 B1 | 12/2015 |
| KR | 10-1653597 B1 | 9/2016 |
| KR | 10-2016-0127901 A | 11/2016 |
| KR | 10-1801559 B1 | 12/2017 |
| KR | 10-2018-0009086 A | 1/2018 |
| KR | 10-1825513 B1 | 3/2018 |
| KR | 10-1828833 B1 | 3/2018 |
| KR | 10-2018-0034737 A | 4/2018 |
| KR | 10-2018-0056004 A | 5/2018 |
| KR | 10-2018-0085246 A | 7/2018 |

* cited by examiner

DISPLAY APPARATUS, STRUCTURE AND MANUFACTURING APPARATUS OF FLEXIBLE DISPLAY APPARATUS

CROSS-REFERENCE TO RELATED APPLICATION

This application claims priority to Republic of Korea Patent Application No. 10-2018-0167954, filed on Dec. 21, 2018, which is hereby incorporated by reference in its entirety for all purposes.

BACKGROUND

Technical Field

The present disclosure relates to a flexible display apparatus, a manufacturing apparatus, and a structure of the flexible display apparatus.

Discussion of the Related Art

A display apparatus is widely used as a display screen of various electronic devices such as a mobile communication terminal, an electronic diary, an electronic book, a portable multimedia player (PMP), a navigator, an Ultra Mobile PC (UMPC), a mobile phone, a smart phone, a tablet personal computer (PC), a watch phone, an electronic pad, a wearable device, a portable information device, a vehicle control display device, a television, a notebook computer, and a monitor.

Since each of a liquid crystal display apparatus, a light emitting display apparatus, a quantum dot display apparatus, and an electrophoresis display apparatus among display apparatuses is able to become a thin profile, studies and development for embodying them as flexible display apparatuses are ongoing. In the flexible display apparatus, a display portion that includes a thin film transistor and lines are formed on a flexible substrate. Since the flexible display apparatus is able to display an image even though it is bent like a paper, the flexible display apparatus may be used for various display fields.

A flexible display apparatus of the related art may comprise a flexible display panel and a cover window coupled to a front surface of the flexible display panel by an adhesive member to protect the flexible display panel.

Recently, the cover window of the flexible display apparatus is changing from a two-dimensional shape having a plate shape to a three-dimensional (3D) shape having a curved portion.

However, bonding between the flexible display panel and the cover window becomes uneven due to the 3D shape of the cover window during a conventional process of attaching the flexible display panel to the cover window using an adhesive member, whereby bubbles are generated by such an uneven bonding between the flexible display panel and the cover window. The bubbles cause a process defect and deteriorate productivity. Particularly, a problem may occur in that cracks are generated in the display panel and the cover window due to the bubbles and therefore cause a defect in quality of the display apparatus.

SUMMARY

An object of the present disclosure is to provide a flexible display apparatus, a manufacturing apparatus, and a structure of the flexible display apparatus, in which a cover window having a 3D shape and a flexible display panel may uniformly be bonded to each other.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a manufacturing apparatus configured to bond a display panel to a cover window having a flat portion between a first curvature portion and a second curvature portion, and may comprise a first attachment portion configured to press a first adhesive surface of the display panel to the flat portion of the cover window, and a 3D attachment portion configured to press a first edge adhesive surface and a second edge adhesive surface of the display panel to the first curvature portion and the second curvature portion of the cover window, respectively, and not press the first adhesive surface of the display panel.

In accordance with another aspect of the present disclosure, the above and other objects can be accomplished by the provision of a manufacturing apparatus configured to bond a display panel to a cover window having a flat portion between a first curvature portion and a second curvature portion, and may comprise a 3D attachment portion configured to press a first edge adhesive surface and a second edge adhesive surface of the display panel to the first curvature portion and the second curvature portion of the cover window, respectively, and not press a first adhesive surface of the display panel between the first edge adhesive surface and the second edge adhesive surface of the display panel, wherein the 3D attachment portion may include a window supporting member configured to support the cover window, and a 3D attachment unit overlapping the window supporting member and having a 3D pressurizing pad configured to press the first edge adhesive surface and the second edge adhesive surface of the display panel to the first curvature portion and the second curvature portion of the cover window, respectively, and not press the first adhesive surface of the display panel.

In accordance with still another aspect of the present disclosure, the above and other objects can be accomplished by the provision of a structure comprising a cover window of which both edges have a shape of a specific angle or more, and at least one layer attached to an inner surface of the cover window without bubbles by an attachment process that does not use a diaphragm.

In accordance with still another aspect of the present disclosure, the above and other objects can be accomplished by the provision of a display apparatus comprising a substrate having a pixel array portion, and a cover window covering the substrate, wherein both edges of the cover window have a shape of a specific angle or more, and at least one layer may be attached to an inner surface of the cover window.

According to the present disclosure, the display panel may be bonded to a curved window having a 3D shape without bubbles or with fewer bubbles than a display panel bonded to a curved window using a conventional manufacturing process, whereby bonding quality between the cover window and the display panel may be improved.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
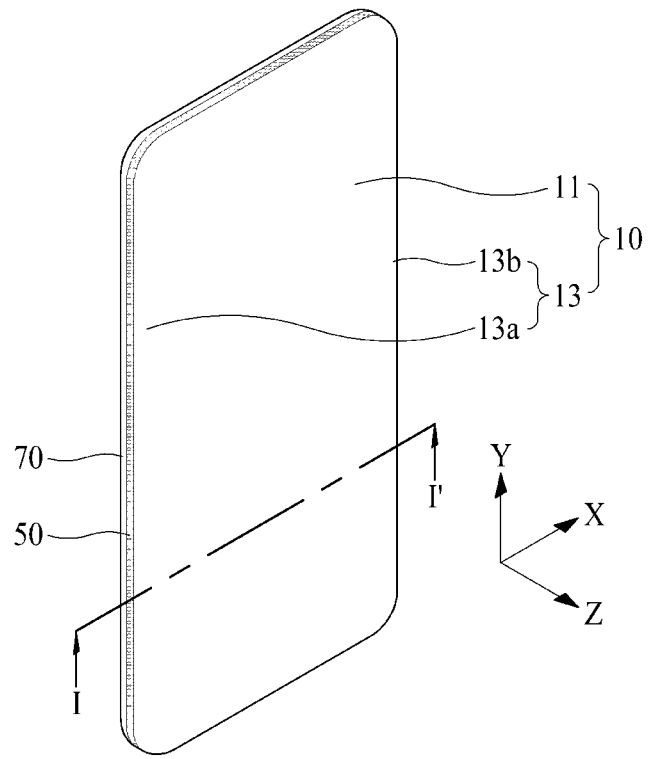
FIG. 1 is a perspective view illustrating an electronic device including a flexible display apparatus according to one embodiment of the present disclosure.

Advantages and features of the present disclosure, and implementation methods thereof will be clarified through following embodiments described with reference to the accompanying drawings. The present disclosure may, however, be configured in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and/or a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only' is used. The terms of a singular form may include plural forms unless referred to the contrary.

In construing an element, the element is construed as including an error range although there is no explicit description.

In describing a position relationship, for example, when the position relationship is described as 'upon,' 'above,' 'below,' and 'next to,' one or more portions may be arranged between two other portions unless 'just' or 'direct' is used.

In describing a time relationship, for example, when the temporal order is described as 'after,' 'subsequent,' 'next,' and 'before,' a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a flexible display apparatus and a manufacturing apparatus and a structure of the flexible display apparatus according to the present disclosure will be described in detail with reference to the accompanying drawings. Wherever possible, the same reference numbers will be used throughout the drawings to refer to the same or like parts.

Figure 2:
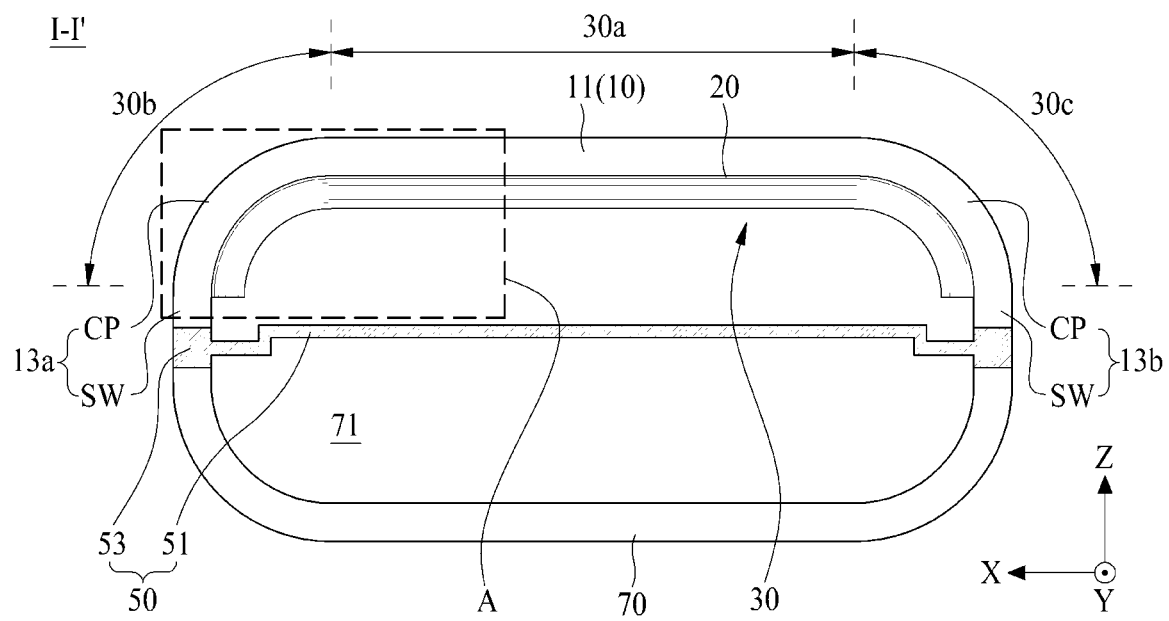
FIG. 2 is a cross-sectional view taken along line I-I' shown in FIG. 1.
Figure 3:
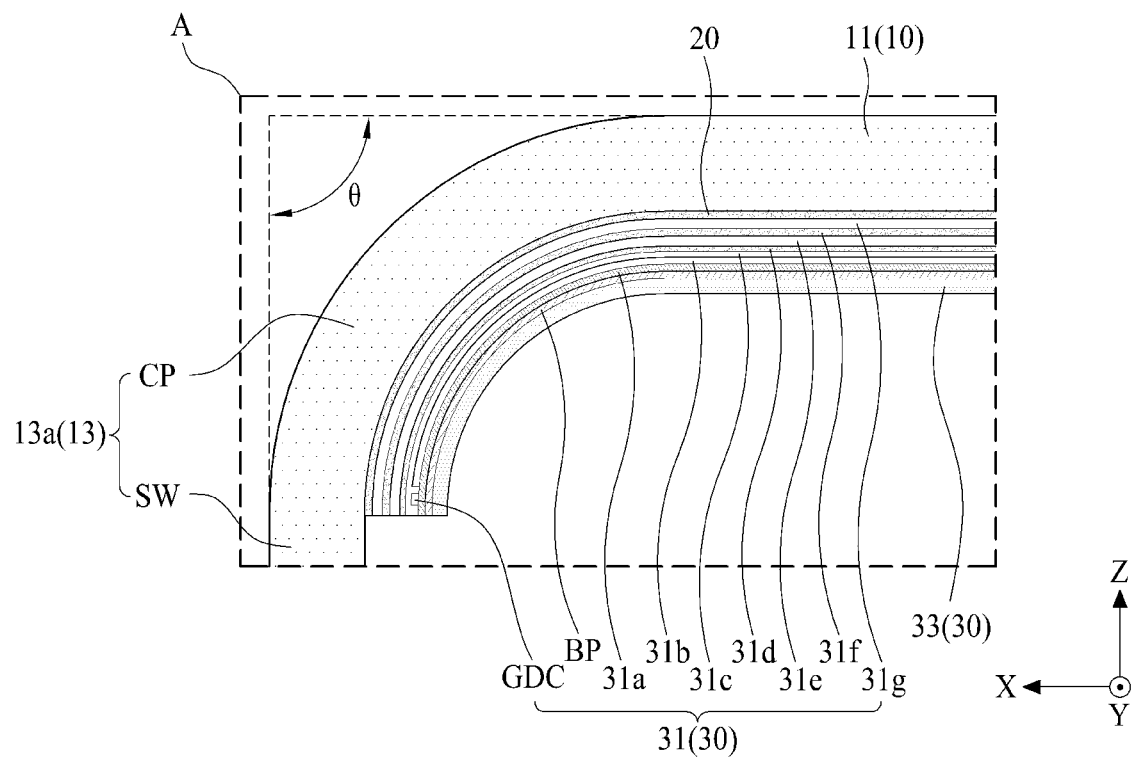
FIG. 3 is an enlarged view illustrating a portion A shown in FIG. 2.

FIG. 1 is a perspective view illustrating an electronic device including a flexible display apparatus according to one embodiment of the present disclosure, FIG. 2 is a cross-sectional view taken along line I-I' shown in FIG. 1, and FIG. 3 is an enlarged view illustrating a portion A shown in FIG. 2.

Referring to FIGS. 1 to 3, the electronic device according to one embodiment of the present disclosure may include a cover window 10, a flexible display module 30, and a middle frame 50. Since a scale of each of the cover window 10, the flexible display module 30 and the middle frame 50 shown in FIGS. 1 and 2 is different from an actual scale for convenience of description, the present disclosure is not limited to the shown scale.

The cover window 10 may serve to protect the flexible display module 30 from external impact by covering a front surface and a side of the flexible display module 30.

The cover window 10 according to one embodiment may be made of a transparent plastic material, a glass material, or a reinforcing glass material. As an example, the cover window 10 may have one or more of a deposited structure of sapphire glass and gorilla glass. As another example, the cover window 10 may include a transparent plastic material such as polyethylene terephthalate (PET). The cover window 10 may be made of reinforcing glass in consideration of scratch-resistant and transparency properties. In this case, the cover window 10 may be expressed as a cover glass.

The cover window 10 according to one embodiment may include a flat window 11 and a curved window 13.

The flat window 11 is a center portion of the cover window 10, and may be a transparent area through which light is transmitted. The flat window 11 may have a flat shape. For example, the flat window 11 may be expressed as a front portion, flat portion, or front window.

The curved window 13 may be curved from an edge of the flat window 11 in a curved shape having a preset curvature radius. In some embodiments, the shortest distance between the curved window 13 and the flat window 11 may be 2.0 mm or more. A height from the flat window 11 to the curved window 13 may be 2.0 mm or more, for example, at least 4.0 mm. A width of the curved window (or both edges) 13 may be 3.0 mm or more.

The curved window 13 according to one embodiment may include a first curvature portion 13a curved from one side (e.g., left edge) of the flat window 11, and a second curvature portion 13b curved from the other side (e.g., right edge) of the flat window 11. In this case, the cover window 10 has a double-sided bending structure (or both-edge bending structure) in which left and right edge areas are curved, whereby an esthetic sense of the electronic device may be improved, and a bezel area in a short-side direction of the electronic device may be reduced.

Each of the first curvature portion 13a and the second curvature portion 13b may include a curved portion CP and a sidewall SW.

The curved portion CP may be curved from the flat window 11 at a specific angle of 60° or more.

As an example, the curved portion CP may have a curved shape section having at least one curvature between an end of the flat window 11 and the sidewall SW based on a second plane configured by a first length direction X and a height direction Z.

As another example, the curved portion CP may have a fan shaped section having a central angle of an acute angle based on the second plane For example, the curved portion CP may have a fan-shaped (or a sector shaped) section having a central angle of 90°.

The sidewall SW may be extended from the end of the curved portion CP to have a certain length. An angle θ between the sidewall SW and the flat window 11 may be, but is not limited to, 60° or more. For example, the angle θ between the sidewall SW and the flat window 11 may range from 80° to 90°.

The curved window 13 according to one embodiment, as shown in FIG. 1, may be curved from all edge areas of the flat window 11 in a curved shape having a preset curvature radius. Therefore, the edge area of the flat window 11 may have a curved structure by the curved window 13. In this case, the cover window 10 has a four-sided bending structure which is fully curved, whereby an esthetic sense of the electronic device may be improved, and a bezel area in each of a long-side direction and a short-side direction of the electronic device may be reduced.

Additionally, the cover window 10 may further include a design (or decoration) layer provided on a rear edge area. The design layer may be printed on the rear (back) edge area of the cover window 10, which faces the flexible display module 30, at least one time to cover a non-display area where an image is not displayed in the electronic device.

The flexible display module 30 may include a flexible light emitting display panel, a flexible organic light emitting display panel, a flexible electrophoresis display panel, a flexible electro-wetting display panel, a flexible micro light emitting diode display panel, or a flexible quantum dot light emitting display panel. In the following description, for purposes of explanation, it is assumed that the flexible display panel is a flexible organic light emitting display panel.

The flexible display module 30 may include at least one layer attached to an inner surface of the cover window 10 of which at least two edge areas are curved at a specific angle or more. The flexible display module 30 may be integrated into the inner surface of the cover window 10 by a bonding process using an elastic pad by an adhesive member 20 not a diaphragm mode, whereby one structure such as an electronic device may be configured together with the cover window 10.

The flexible display module 30 may be coupled with the rear surface (or back surface) of the cover window 10 to display an image and/or sense a user's touch. The flexible display module 30 may be bonded to the flat window 11 and the curved window 13 of the cover window 10 through a bonding process using an elastic pad by the adhesive member 20 and not the diaphragm mode. The adhesive member 20 may include a pressure sensitive adhesive (PSA) or an optically clear adhesive (OCA). The adhesive member 20 may be expressed as a transparent adhesive member, a transparent adhesive sheet, or a panel bonding member.

As shown in the embodiment of FIG. 2, the flexible display module 30 according to one embodiment may include a flat display portion 30a configured to display an image toward the flat window 11 of the cover window 10, a first bending display portion 30b configured to bend from one edge of the flat display portion 30a in a curved shape to display an image toward the first curvature portion 13a of the curved window 13 of the cover window 10, and a second bending display portion 30c configured to bend from the other edge of the flat display portion 30a in a curved shape to display an image toward the second curvature portion 13b of the curved window 13 of the cover window 10.

The flexible display module 30 according to one embodiment may include a flexible display panel 31 including display portions 30a, 30b, and 30c, and a heat dissipating sheet portion 33 coupled to the rear surface (back surface) of the flexible display panel 31.

The flexible display panel 31 may display images on the display portions 30a, 30b and 30c that include the flat display portion 30a, the first bending display portion 30b and the second bending display portion 30c.

In the flexible display panel 31, the flat display portion 30a may uniformly be attached to at least a part of or the entire flat window 11 without bubbles or with fewer bubbles than a flexible display panel attached to a flat portion of a window using conventional manufacturing processes. The first bending display portion 30b may uniformly be attached to the first curvature portion 13a curved from the flat window 11 without bubbles or with fewer bubbles than a flexible display panel attached to a curved portion of a window using conventional manufacturing processes to have a specific angle or more, for example, 60° or more. The second bending display portion 30c may uniformly be attached to the second curvature portion 13b curved from the flat window 11 without bubbles or with fewer bubbles than a flexible display panel attached to a curved portion of a window using conventional manufacturing processes to have a specific angle or more, for example, 60° or more. In this case, the flat display portion 30a may uniformly be attached to at least a part of or the entire flat window 11 without bubbles or with reduced bubbles by a pre-attachment process using a pre-attachment elastic pad configured to locally pressurize the flat display portion 30a, and the first and second bending display portions 30b and 30c may uniformly be attached to the curvature portions 13a and 13b, respectively, without bubbles or with reduced bubbles by an attachment process (or a main-attachment process) using an attachment elastic pad (or a main-attachment elastic pad) configured to locally pressurize the bending display portions 30b and 30c and not the flat display portion 30a. The first bending display portion 30b and the second bending display portion 30c may be attached to the curved window 13 even by the diaphragm manner. However, in the diaphragm manner in conventional processes, since a film (or membrane) of the diaphragm is not modified to (or deformed into) a shape, which follows a 3D shape of the curved window 13 curved at an angle of 60° or more, bubbles may be generated between the curved window 13 and the flexible display panel 31. On the other hand, if the attachment elastic pad configured to locally pressurize the bending display portions 30b and 30c is used, the attachment elastic pad having a relatively high strain compared with the film of the diaphragm may elastically be deformed in a shape that follows a 3D shape of the curved window 13 curved at an angle of 60° or more, whereby the attachment elastic pad may uniformly bond the curved window 13 to the flexible display panel 31 without bubbles or with reduced bubbles by pressurizing the flexible display panel 31 to be suitable for the 3D shape of the curved window 13.

The flexible display panel 31 according to one embodiment may include a flexible substrate 31a, a pixel array portion 31b, a gate driving circuit GDC, an encapsulation portion 31c, a touch electrode portion 31e, a functional film 31g, and a back plate BP.

The flexible substrate 31a may be defined as a base substrate of the flexible display panel 31. The flexible substrate 31a according to one embodiment may include a flexible plastic material, for example, opaque or colored polyimide (PI). The flexible substrate 31a according to another embodiment may be made of a thin type glass material having flexibility.

The pixel array portion 31b according to one embodiment may be formed on the display portions 30a, 30b, and 30c defined on the flexible substrate 31a to display an image on the flat display portion 30a, the first bending display portion 30b, and the second bending display portion 30c.

The pixel array portion 31b may include a plurality of pixels provided in a pixel area defined by signal lines provided on the flexible substrate 31a, displaying images in accordance with signals supplied to signal lines. The signal lines may include gate lines, data lines, and pixel driving power lines.

Each of the plurality of pixels may include a pixel circuit layer including a driving thin film transistor provided in the pixel area, an anode electrode electrically connected with the driving thin film transistor, a light emitting diode layer formed on the anode electrode, and a cathode electrode electrically connected with the light emitting diode layer.

The driving thin film transistor is provided in a transistor area of each pixel area defined on the flexible substrate 31a, and may include a gate electrode, a gate insulating film, a semiconductor layer, a source electrode, and a drain electrode. In this case, the semiconductor layer of the thin film transistor may include a silicon such as a-Si, poly-Si, or low temperature poly-Si, or may include an oxide such as Indium-Gallium-Zinc-Oxide (IGZO).

The anode electrode is provided in an opening area defined in each pixel area in a pattern shape and therefore electrically connected with the driving thin film transistor.

The light emitting diode layer according to one embodiment may include an organic light emitting diode formed on the anode electrode. The organic light emitting diode may be configured to emit light of the same color per pixel, for example, white light, or may be configured to emit light of a color different per pixel, for example, red light, green light, or blue light, among other colors.

The light emitting diode layer according to another embodiment may include a micro light emitting diode element electrically connected with each of the anode electrode and the cathode electrode. The micro light emitting diode element is a light emitting diode configured in the form of an integrated circuit (IC) or chip, and may include a first terminal electrically connected with the anode electrode and a second terminal electrically connected with the cathode electrode.

The cathode electrode may commonly be connected with the light emitting diodes of the light emitting diode layers provided in the respective pixel areas.

The gate driving circuit GDC may be formed on first and/or second edge areas of the flexible substrate 31a and therefore connected with one end and/or the other end of each of a plurality of gate lines provided on the flexible substrate 31a. The gate driving circuit GDC may generate a gate signal in response to a gate control signal supplied through a display pad portion provided in the flexible substrate 31a and supply the generated gate signal to each of the plurality of gate lines. The gate driving circuit may be a gate built-in circuit formed together with the manufacturing process of the thin film transistor of the pixel, but is not limited thereto.

The encapsulation portion 31c may be formed on the flexible substrate 31a to surround the pixel array portion 31b, thereby preventing oxygen or water from being permeated, or reducing an amount of oxygen or water or other contaminants being permeated, into the light emitting diode layer of the pixel array portion 31b. The encapsulation portion 31c according to one embodiment may be formed in a multi-layered structure in which an organic material layer and an inorganic material layer are alternately deposited. In this case, the inorganic material layer may serve to shield oxygen or water from being permeated, or mitigate any permeation of oxygen or water or other contaminants, into the light emitting diode layer of the pixel array portion 31b. The organic material layer may be formed to be relatively thicker than the inorganic material layer to cover particles that may be generated during a manufacturing process. For example, the encapsulation portion 31c may include a first inorganic film, an organic film on the first inorganic film, and a second inorganic film on the organic film. In this case, the organic film may be defined as a particle cover layer.

The touch electrode portion 31e serves as a touch sensor arranged on the encapsulation portion 31c, sensing a user's touch.

The touch electrode portion 31e according to one embodiment may include a touch electrode layer arranged on the encapsulation portion 31c overlapped with the pixel array portion 31b, and a dielectric layer covering the touch electrode layer. Optionally, the touch electrode portion 31e may be formed on a touch buffer layer covering the encapsulation portion 31c. For example, the touch electrode layer may include a plurality of touch driving electrodes arranged on the encapsulation portion 31c overlapped with the pixel array portion 31b at constant intervals, and a plurality of touch sensing electrodes electrically insulated from the plurality of touch driving electrodes. The touch sensing electrodes may be arranged on the same layer as the touch driving electrodes, or the touch sensing electrodes and the touch driving electrodes may be arranged on their respective layers different from each other by interposing the dielectric layer therebetween.

The touch electrode portion 31e according to another embodiment may be replaced with a capacitance type touch panel known to one skilled in the art. In this case, the touch panel may be attached onto the encapsulation portion 31c by a transparent adhesive member 31d. In this case, the transparent adhesive member 31d may include a pressure sensitive adhesive (PSA) or an optically clear resin (OCR).

The functional film 31g may be attached onto the touch electrode portion 31e by a transparent adhesive member 31f.

The functional film 31g according to one embodiment may include a polarizing film for improving outdoor visibility and contrast ratio for an image displayed on the flexible display panel 31 by preventing or reducing reflection of external light. For example, the functional film 31g may include an optical isotropic lower film, a polarizing film coupled and supported onto the optical isotropic lower film, and an optical isotropic upper film coupled and supported onto the polarizing film. The polarizing film may include a circular polarizer that shields external light incident through the cover window 10 and reflected by a thin film transistor and/or lines arranged on the pixel array portion 31b from progressing to the cover window 10. The optical isotropic lower film of the function film 31g may be attached onto the touch electrode portion 31e by the transparent adhesive member 31f.

The back plate BP is attached to the rear surface (back surface) of the flexible substrate 31a overlapped with the pixel array portion 31b to maintain the rear surface (or back surface) of the flexible substrate 31a overlapped with the pixel array portion 31b in a flat state. For example, the back plate BP may be, but is not limited to, polyethylene terephthalate (PET).

The heat dissipating sheet portion 33 may be attached to at least a part of or the entire rear surface of the back plate BP. The heat dissipating sheet portion 33 may serve to protect the flexible display panel 31 from impact and dissipate heat of the flexible display panel 31. The heat dissipating sheet portion 33 according to one embodiment may include a heat dissipating sheet, a cushion member, and an adhesive member.

The heat dissipating sheet (or heat radiation sheet) may include a heat dissipating layer having a metal material with relatively high heat conductivity. The heat dissipating sheet according to one embodiment may include a metal layer such as copper (Cu). The heat dissipating sheet according to another embodiment may include a metal layer such as Cu and a graphite layer coated on the metal layer. The heat dissipating sheet may have a heat dissipation function, a ground function, and a function of protecting the rear surface of the flexible display panel 31.

The cushion member may include a foam tape coupled to the heat dissipating sheet. The cushion member may serve to attenuate impact.

The adhesive member may be coupled with the cushion member. The adhesive member may include an uneven structure (or embossing structure) formed on a surface. The uneven structure of the adhesive member is able to omit a process for removing bubbles generated between the back plate BP and the heat dissipating sheet portion 33 by preventing or mitigating bubbles from being generated between the back plate BP and the heat dissipating sheet portion 33 during attachment between the back plate BP and the heat dissipating sheet portion 33.

The middle frame 50 may support the cover window 10 and cover the rear surface of the flexible display module 30. The middle frame 50 may be arranged on the outmost side of the electronic device, and may include a plastic material or a metal material. The middle frame 50 may include a metal material having a color coating layer. The middle frame 50 according to one embodiment may be made of a metal material, for example, aluminum material, which has relatively high heat conductivity, to improve heat dissipation performance of the electronic device.

The middle frame 50 according to one embodiment may include a middle plate 51 and a middle sidewall 53.

The middle plate 51 may be arranged on the rear surface of the flexible display module 30. In this case, the middle plate 51 may include at least one open portion through which a cable for electrical connection between a display driving circuit connected to the flexible display panel 31 and a host driving system passes, and at least one recessed portion in which various electronic circuit components built in the electronic device are arranged.

The middle sidewall 53 may vertically be coupled with a side of the middle plate 51 to support the curved window 13 of the cover window 10. For example, the middle sidewall 53 may be coupled with the curved window 13 of the cover window 10 by a double-sided tape or a waterproof tape. In this case, waterproof performance of the electronic device may be improved, and permeation of particles may be avoided or mitigated.

The electronic device according to one embodiment of the present disclosure may further include a back cover 70 for covering the rear surface (or back surface) of the middle frame 50.

The back cover 70 may be coupled to the middle sidewall 53 to face the rear surface of the middle plate 51 and therefore provides a circuit storage space 71 on the rear surface of the middle frame 50 by covering the rear surface (or back surface) of the middle frame 50. The circuit storage space 71 may be provided between the middle plate 51 of the middle frame 50 and the back cover 70 to store a host driving system, a memory, a battery, etc. The back cover 70 may detachably be coupled to the middle sidewall 53 for battery exchange according to battery discharge in the middle of using the electronic device, or may be coupled to the middle sidewall 53 detachably during disassembly for repair of the electronic device.

The back cover 70 according to one embodiment may be arranged on the rear surface of the outmost of the electronic device, and may include at least one of a plastic material, a metal material, and a glass material and may include a color coating layer. For example, the back cover 70 according to one embodiment may be a flat glass having a transparent, semi-transparent, or opaque color coating layer.

The back cover 70 according to another embodiment may have the same shape as that of the cover window 10, and may include a glass material having a color coating layer. For example, the back cover 70 according to another embodiment may have a symmetrical structure with the cover window 10 by interposing the middle frame 50, and may include a transparent, semi-transparent, or opaque color coating layer.

Figure 4:
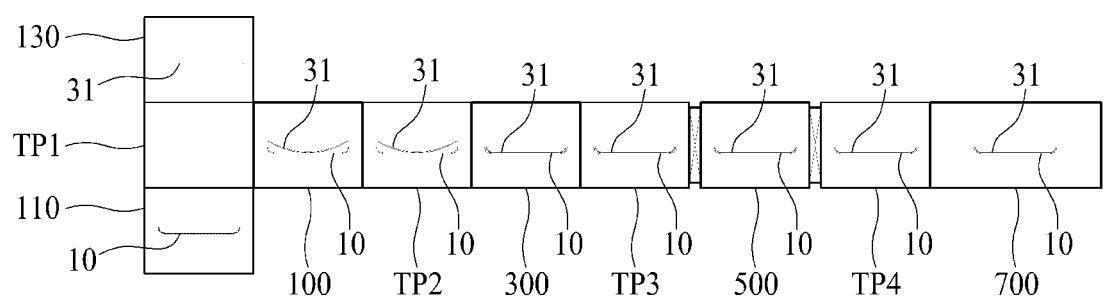
FIG. 4 is a view conceptually illustrating a manufacturing apparatus of a flexible display apparatus according to one embodiment of the present disclosure.

FIG. 4 is a view conceptually illustrating a manufacturing apparatus of a flexible display apparatus according to one embodiment of the present disclosure, and illustrates an apparatus (or manufacturing system) for bonding the cover window and the flexible display panel shown in FIGS. 2 and 3 to each other.

Referring to FIG. 4 together with FIGS. 2 and 3, the manufacturing apparatus of the flexible display apparatus according to one embodiment of the present disclosure may bond a flexible display panel 31 (hereinafter, referred to as "display panel 31") to a cover window 10 including a flat window 11 and a curved window 13 curved from the flat window 11. The manufacturing apparatus of the flexible display apparatus according to one embodiment of the present disclosure may be a 3D laminating apparatus or window laminating apparatus.

The manufacturing apparatus of the flexible display apparatus according to one embodiment may include a first transfer portion TP1, a first attachment portion 100, a second transfer portion TP2, a second attachment portion 300, a third transfer portion TP3, and a 3D attachment portion 500.

The first transfer portion TP1 loads each of the cover window 10 and the display panel 31 in the first attachment portion 100. For example, the first transfer portion TP1 may pick up one cover window 10 from a window cassette in which a plurality of cover windows 10 are loaded or a conveyer belt through the cover windows 10 are continuously retransferred, and may load the picked-up cover windows 10 in the first attachment portion 100. The second transfer portion TP2 may pick up one display panel 31 from a panel cassette in which a plurality of display panels 31 are loaded or a conveyer belt through the display panels 31 are continuously retransferred, and may load the picked-up display panels 31 in the first attachment portion 100. The first transfer portion TP1 according to one embodiment may include at least one first transfer robot for loading each of the cover window 10 and the display panel 31 in the first attachment portion 100 by using a loading arm that includes a pick-up unit.

Figure 5:
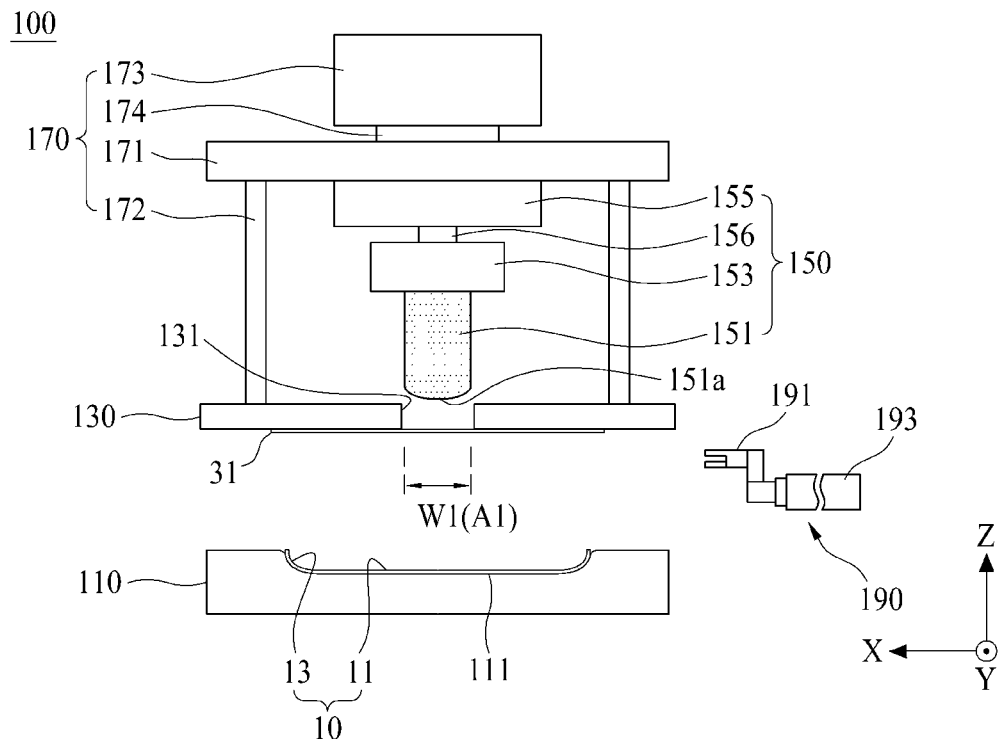
FIG. 5 is a view illustrating a first attachment portion according to one embodiment shown in FIG. 4.
Figure 7:
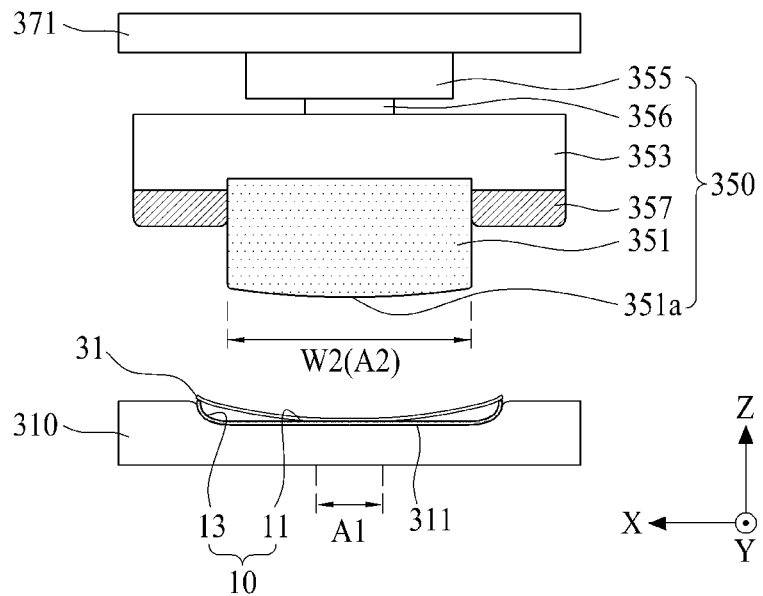
FIG. 7 is a view illustrating a second attachment portion according to one embodiment shown in FIG. 4.

An adhesive sheet (or an adhesive member) 20 is attached to a front surface of the display panel 31 picked up in the first transfer portion TP1. In this case, one surface of the adhesive sheet 20 is attached to the functional film 31g of the display panel 31, and the other surface of the adhesive sheet 20 is covered by a protective film (or delamination film). The display panel 31 to which the adhesive sheet 20 is attached may be categorized (or divided) into a second adhesive surface having a first adhesive surface to be attached to the flat window 11 of the cover window 10, and at least one edge adhesive surface to be attached to the curved window 13 of the cover window 10. The second adhesive surface (A2 as shown in FIG. 7) has a greater area than the first adhesive surface (A1 as shown in FIG. 5). The second adhesive surface may be between a first edge adhesive surface and a second edge adhesive surface. The first adhesive surface of the display panel 31 may be overlapped with a middle portion of the display panel 31, the second adhesive surface of the display panel 31 may be overlapped with a flat display portion, and the edge adhesive surface of the display panel 31 may be overlapped with a bending display portion.

The first attachment portion 100 is loaded with each of the display panel 31 and the cover window 10 from the first transfer portion TP1, and therefore attaches (or pre-attaches) the first adhesive surface of the display panel 31 to one portion of the cover window 10. At this stage, not all portions of the second adhesive surface of the display panel 31 may be attached yet (or contacted) to the inner surface of the cover window 10.

The first attachment portion 100 according to one embodiment may align a position of the cover window 10 and a position of the display panel 31, which are loaded from the first transfer portion TP1, delaminate or peel the protective film of the adhesive sheet attached to the display panel 31, and then attach (or pre-attach) the first adhesive surface of the display panel 31 to one portion of the cover window 10. The first adhesive surface of the display panel 31 and one portion of the cover window 10 may be parallel or aligned with a long-side length direction (or second direction Y) of the display panel 31. One portion of the cover window 10 according to one embodiment may be one portion of the flat window 11, for example, middle portion. In this case, the first adhesive surface of the display panel 31 and the middle portion of the cover window 10 may be arranged at a middle portion of a short-side length direction of the display panel 31 in parallel or aligned with a second direction Y. The first attachment portion 100 may attach (or pre-attach) the first adhesive surface of the display panel 31 to one portion of the cover window 10 in the atmosphere of a normal pressure.

The second transfer portion TP2 draws (or unloads) the cover window 10 to which the first adhesive surface of the display panel 31 is attached, out of the first attachment portion 100 and loads the cover window 10 in the second attachment portion 300. The second transfer portion TP2 according to one embodiment may include a second transfer robot for picking up the cover window 10 to which the first adhesive surface of the display panel 31 is attached, from the first attachment portion 100 by using a loading arm that includes a pick-up unit and loading the picked-up cover window 10 in the second attachment portion 300. For example, the second transfer robot may pick up the cover window 10 by vacuum adsorbing the rear surface of the display panel 31 overlapped with the first adhesive surface of the display panel 31 attached to one portion of the cover window 10 through the pick-up unit. In this case, the pick-up unit of the second transfer robot may vacuum adsorb the rear surface of the back plate BP overlapped with the first adhesive surface of the display panel 31.

The second attachment portion 300 is loaded with the cover window 10 to which the first adhesive surface of the display panel 31 is attached, from the second transfer portion TP2, and therefore attaches (or pre-attaches) the second adhesive surface (A2 as shown in FIG. 7) of the display panel 31 to at least a part of or the entire flat window. In this case, the edge adhesive surface of the display panel 31 may not yet be attached to the curved window 13 of the cover window 10, and an edge end of the display panel 31 may be in contact with the sidewall SW of the curved window 13 in a non-attachment state.

The second attachment portion 300 according to one embodiment may align a position of the cover window 10 loaded from the second transfer portion TP2, pressurize (or compress) the second adhesive surface of the display panel 31 and attach (pre-attach) the second adhesive surface of the display panel 31 to the flat window 11 of the cover window 10. Therefore, the second adhesive surface including the first adhesive surface (and not the edge adhesive surface of the display panel 31) may be attached to at least a part of or the entire flat window 11 of the cover window 10. The second attachment portion 300 may attach the second adhesive surface of the display panel 31 to at least a part of or the entire flat window 11 of the cover window 10 in the atmosphere of a normal pressure.

The third transfer portion TP3 draws (or unloads) the cover window 10 to which the second adhesive surface of the display panel 31 is attached, out of the second attachment portion 300 and loads the cover window 10 in a 3D attachment portion 500. The third transfer portion TP3 according to one embodiment may include a third transfer robot for picking up the cover window 10 to which the second adhesive surface of the display panel 31 is attached, from the second attachment portion 300 by using a loading arm that includes a pick-up unit and loading the picked-up cover window 10 in the 3D attachment portion 500. For example, the third transfer robot may pick up the cover window 10 by vacuum adsorbing the rear surface of the display panel 31 overlapped with the second adhesive surface of the display panel 31 attached to the flat window 11 of the cover window 10 through the pick-up unit. In this case, the pick-up unit of the third transfer robot may vacuum adsorb the rear surface of the back plate BP overlapped with the second adhesive surface of the display panel 31.

The 3D attachment portion 500 is loaded with the cover window 10 to which the second adhesive surface of the display panel 31 is attached, from the third transfer portion TP3, and therefore attaches (or pre-attaches) the edge adhesive surface of the display panel 31 to at least a part of or the entire curved window 13 of the cover window 10.

The 3D attachment portion 500 according to one embodiment may align a position of the cover window 10 loaded from the third transfer portion TP3, pressurize (or compress) the edge adhesive surface of the display panel 31, and attach (or pre-attach) the edge adhesive surface of the display panel 31 to the curved window 13 of the cover window 10. Therefore, the edge adhesive surface of the display panel 31 may be attached to the curved window 13 of the cover window 10 and therefore bonded to the inner surface of the cover window 10.

The 3D attachment portion 500 according to one embodiment may perform an attachment process between the edge adhesive surface of the display panel 31 and the curved window 13 of the cover window 10 in the atmosphere of vacuum. For example, since the curved window 13 of the cover window 10 includes a 3D shape having a curved portion CP and a sidewall SW, if the attachment process is performed in the atmosphere of a normal pressure and not the atmosphere of vacuum, bubbles may be generated between the curved portion CP of the curved window 13 and the edge adhesive surface of the display panel 31 or in the adhesive sheet 20, whereby a process defect may be generated due to an uneven bonding between the curved window 13 and the edge adhesive surface of the display panel 31.

The manufacturing apparatus of the flexible display apparatus according to one embodiment of the present disclosure may further include a fourth transfer portion TP4 and a hardening portion 700.

The fourth transfer portion TP4 draws (or unloads) the cover window 10 to which the adhesive surfaces of the display panel 31 are each attached, out of the 3D attachment portion 500 and loads the cover window 10 in the hardening portion 700. The fourth transfer portion TP4 according to one embodiment may include a fourth transfer robot for picking up the cover window 10 to which the display panel 31 is fully attached, from the 3D attachment portion 500 by using a loading arm that includes a pick-up unit and loading the picked-up cover window 10 in the hardening portion 700. For example, the fourth transfer robot may pick up the cover window 10 by vacuum adsorbing the rear surface of the display panel 31 attached to the inner surface of the cover window 10 through the pick-up unit. In this case, the pick-up unit of the fourth transfer robot may vacuum adsorb the rear surface of the back plate BP.

The hardening portion 700 is loaded with the cover window 10 to which the display panel 31 is fully attached, from the fourth transfer portion TP4, and therefore hardens the adhesive sheet 20 interposed between the display panel 31 and the cover window 10. The hardening portion 700 according to one embodiment may include a retransfer tray for supporting the cover window 10 loaded from the fourth transfer portion TP4, a retransfer conveyer belt for continuously transferring the retransfer tray, and a light irradiation unit arranged on and/or below the retransfer conveyer belt.

The manufacturing apparatus of the flexible display apparatus according to one embodiment of the present disclosure described as above may uniformly bond the cover window 10 having the 3D shape to the display panel 31 without bubbles or with reduced bubbles between the display panel 31 and the cover window 10 of the 3D shape by sequentially (or individually) attaching the display panel 31 to each of the flat window 11 and the curved window 13 of the cover window 10 through a separate local attachment process. Particularly, the manufacturing apparatus of the flexible display apparatus according to one embodiment of the present disclosure may uniformly bond the display panel 31 to the inner surface of the cover window 10 of which both edges have a shape of a specific angle or more, without bubbles or with reduced bubbles by pressurizing the edge adhesive surface of the display panel 31 in a shape that follows the 3D shape of the curved widow 13 by a local attachment process through the 3D attachment portion using an elastic deformation pad that follows the 3D shape of the curved window 13 and without using a diaphragm mode. Therefore, in the present disclosure, bonding quality between the cover window 10 and the display panel 31 may be improved, whereby productivity and yield of the electronic device including the flexible display apparatus may be improved.

FIG. 5 is a view illustrating a first attachment portion according to one embodiment shown in FIG. 4.

Referring to FIG. 5 together with FIG. 4, the first attachment portion 100 according to one embodiment of the present disclosure may include a first window supporting stage 110, a panel supporting stage 130, and a first attachment unit 150.

The first window supporting stage 110 may support the cover window 10 loaded from the first transfer portion TP1. The first window supporting stage 110 according to one embodiment may include a first window supporting groove 111 corresponding to a 3D shape of the cover window 10 and a plurality of window adsorption holes arranged on the bottom of the first window supporting groove 111. The first window supporting stage 110 may vacuum adsorb the cover window 10 supported in the first window supporting groove 111 through the plurality of window adsorption holes. In this case, the front surface of the cover window 10 may be in contact with the bottom of the first window supporting groove 111, and the inner surface (or panel bonding surface) of the cover window 10 may directly face an upper portion of the first window supporting stage 110 or the panel supporting stage 130. For example, the cover window 10 may be supported in the first window supporting stage 110 in a state that the front surface and the inner surface are inverted up and down. The first window supporting stage 110 may be expressed as a window adsorption stage or window clamp stage.

The panel supporting stage 130 may support the rear surface of the display panel 31 loaded from the first transfer portion TP1. The panel supporting stage 130 according to one embodiment may include a plurality of panel adsorption holes arranged on a panel support surface facing the first window supporting stage 110 and a pad through hole 131 overlapped with the first adhesive surface A1 of the display panel 31 and/or one portion of the cover window 10. The panel supporting stage 130 may vacuum adsorb the rear surface of the display panel 31 loaded from the first transfer portion TP1 through the plurality of panel adsorption holes. In this case, the rear surface of the display panel 31, for example, the back plate of the display panel 31 may be supported by being adsorbed in the panel adsorption holes, and the front surface of the display panel 31 may face or directly face the first window supporting stage 110. A protective film PF of the adhesive sheet may be arranged on a forefront surface of the display panel 31 loaded from the first transfer portion TP1.

The pad through hole 131 (or pad through opening 131) may have a width wider than a first width W1 of the first adhesive surface A1 defined in the display panel 31 in a first direction X. Also, the pad through hole 131 may have a length equal to or longer than a long side length of the display panel 31 in a second direction Y. For example, the pad through hole 131 may be formed by vertically passing through the panel supporting stage 130 to have a rectangular shape including a pair of short-sides in (e.g., parallel with) the first direction X and a pair of long-sides in (e.g., parallel with) the second direction Y on a plane.

The first attachment unit 150 may attach the first adhesive surface A1 of the display panel to one portion of the flat window 11 by passing through the panel supporting stage 130. The first attachment unit 150 according to one embodiment may include a first pressurizing pad 151, a first pad supporting block 153, and a first pad lifting unit 155.

The first pressurizing pad (or first pre-attachment pad) 151 may attach the first adhesive surface A1 of the display panel 31 supported in the panel supporting stage 130 to one portion of the flat window 11 by passing through the pad through hole 131 provided in the panel supporting stage 130. The first pressurizing pad 151 may be an elastic pad or elastic deformation pad, but is not limited thereto.

The first pressurizing pad 151 according to one embodiment may be configured to be inserted into the pad through hole 131 provided in the panel supporting stage 130. For example, the first pressurizing pad 151 may have a bar shape including a width narrower than the width of pad through hole 131 and the same as the first width W1 of the first adhesive surface A1 defined in the display panel 31 and a length shorter than the length of the pad through hole 131. An upper surface of the first pressurizing pad 151 may be fixed to the first pad supporting block 153. A lower surface of the first pressurizing pad 151 is a panel pressurizing surface 151a for pressurizing the first adhesive surface A1 of the display panel 31 and may have a convex curved shape.

The first pressurizing pad 151 according to one embodiment may be made of an elastic material at least partially deformed to prevent or mitigate any damage or scratch of the display panel 31 from occurring during a contact with the display panel 31. For example, the first pressurizing pad 151 may include at least one of polymer silicon, urethane rubber, and synthetic resin. The first pressurizing pad 151 made of such an elastic material may pressurize the first adhesive surface A1 of the display panel 31 to one portion of the flat window 11 while being elastically deformed in accordance with a direct contact with the rear surface of the display panel 31 overlapped with the first adhesive surface A1 of the display panel 31.

The first pad supporting block (or the first pad stage) 153 may support the first pressurizing pad 151. The first pad supporting block 153 according to one embodiment may include a metal material. For example, the first pad supporting block 153 may include an aluminum material.

The first pad lifting unit 155 may support the first pad supporting block 153 to lift the first pad supporting block 153. The first pad lifting unit 155 according to one embodiment may include a pneumatic cylinder or hydraulic cylinder having a pad lifting axis 156 coupled with the first pad supporting block 153.

The first attachment unit 150 according to one embodiment may further include a coating layer formed on the panel pressurizing surface 151a of the first pressurizing pad 151. The coating layer may prevent or mitigate damage or scratch of the display panel 31 occurring due to a physical contact between the panel pressurizing surface 151a and the display panel 31 by reducing friction between the panel pressurizing surface 151a and the display panel 31 and may facilitate detachment between the first pressurizing pad 151 and the display panel 31. The coating layer according to one embodiment may be made of a material having a friction coefficient of 0.05 to 0.1, and may be made of a material having the same elastic rate as that of the first pressurizing pad 151 or an elastic ratio of 200 to 400. For example, the coating layer may include polytetrafluoroethylene (PTFE) having an elastic rate of 200 to 400 and a friction coefficient of 0.05 to 0.1.

The first attachment portion 100 according to one embodiment of the present disclosure may further include a stage driving unit 170.

The stage driving unit 170 may include a first alignment stage 171 and a first stage lifting unit 173.

The first alignment stage 171 supports the panel supporting stage 130 and the first attachment unit 150, and aligns a position of the display panel 31 supported in the panel supporting stage 130 and a position of the cover window 10 supported in the first window supporting stage 110. For example, the first alignment stage 171 may support the panel supporting stage 130 through a plurality of support members 172 and support the first attachment unit 150. In this case, the first pad lifting unit 155 of the first attachment unit 150 may be arranged between the first alignment stages 171 and therefore coupled with a lower surface of the first alignment stage 171, and the first pressurizing pad 151 may be arranged on the pad through hole 131 provided in the panel supporting stage 130.

The first alignment stage 171 according to one embodiment may be configured as a UVW stage, e.g., configured to adjusted in the X, Y, and Z directions using motors. The first alignment stage 171 aligns the position of the display panel 31 and the position of the cover window 10 by simultaneously moving the panel supporting stage 130 and the first attachment unit 150 in the X-axis direction and/or Y-axis direction. Since the UVW stage has elements known in the art, its detailed description will be omitted.

The first stage lifting unit 173 may lower or raise the first alignment stage 171 in accordance with an attachment process order. For example, the first stage lifting unit 173 may include a pneumatic cylinder or hydraulic cylinder having a stage lifting axis 174 provided in a ceiling frame of a base frame provided in the first attachment portion 100 and coupled with the first alignment stage 171.

The first attachment portion 100 according to one embodiment of the present disclosure may further include a film delamination unit 190.

The film delamination unit 190 is loaded in the first attachment portion 100 from the first transfer portion TP1 and delaminates or peels the protective film PF of the adhesive sheet attached to the display panel 31 supported in the panel supporting stage 130. The film delamination unit 190 according to one embodiment may include a clamp unit 191 and a clamp transfer unit 193.

The clamp unit 191 may clamp a delamination grip provided in the protective film PF of the adhesive sheet attached to the display panel 31 if the panel supporting stage 130 of the display panel 31 is supported by the first transfer portion TP1 and aligned with the cover window 10. The clamp unit 191 according to one embodiment may include a clamp for clamping the delamination grip of the protective film PF and a clamp lifting unit for lifting the clamp so that the clamp can clamp the delamination grip.

Figure 6A:
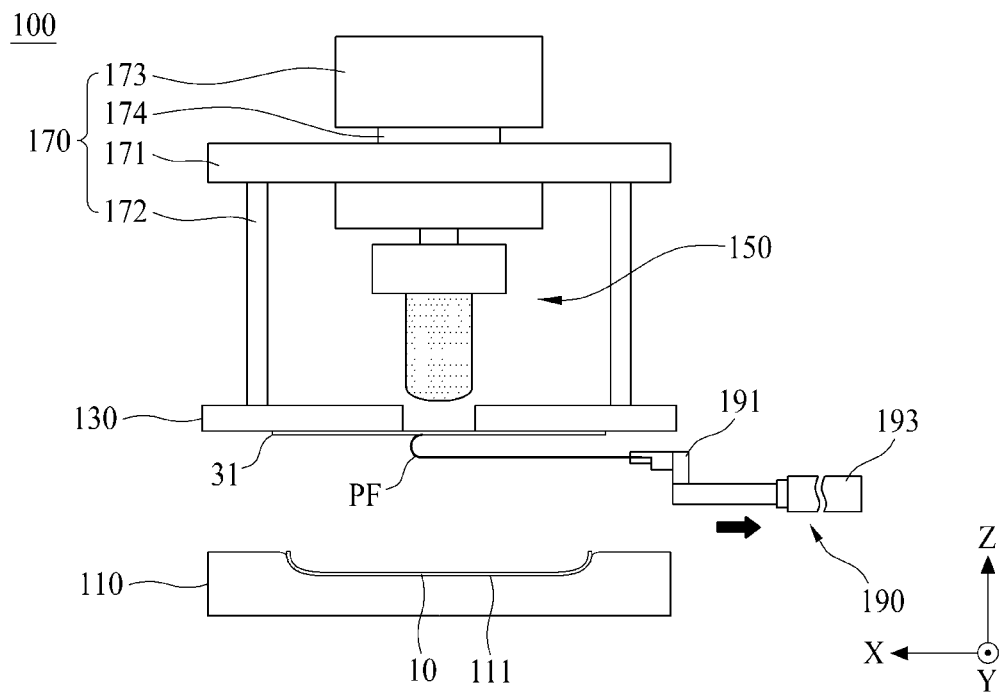
FIGS. 6A, 6B, and 6C are views illustrating an attachment process of a first attachment portion according to one embodiment of the present disclosure.
Figure 6B:
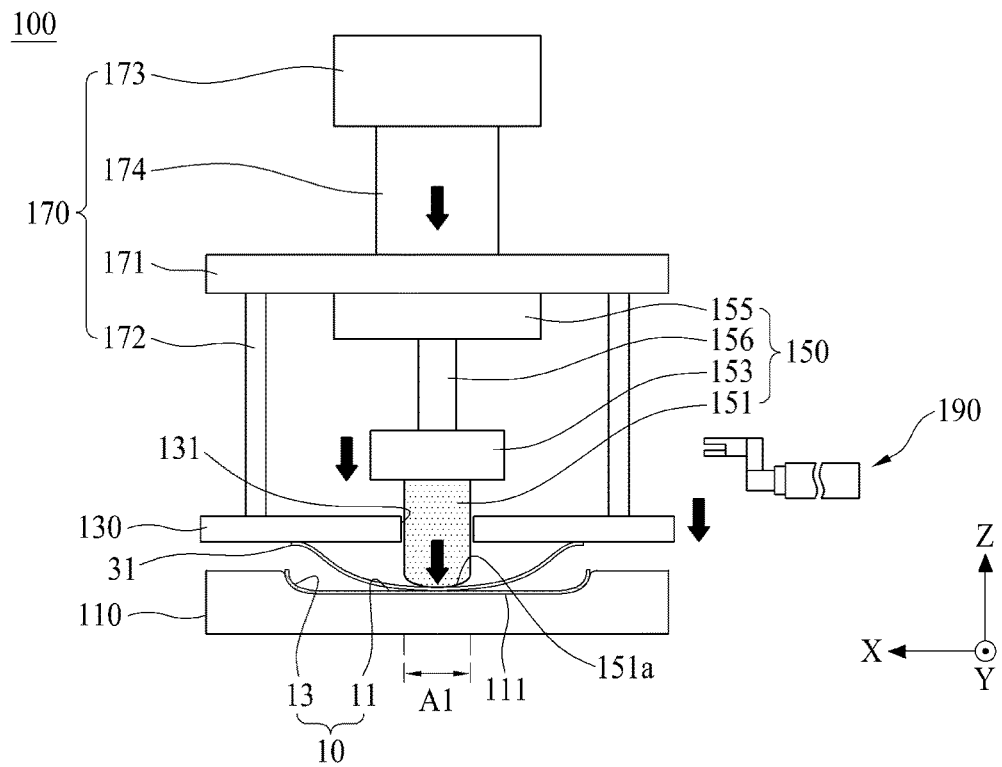
Figure 6C:
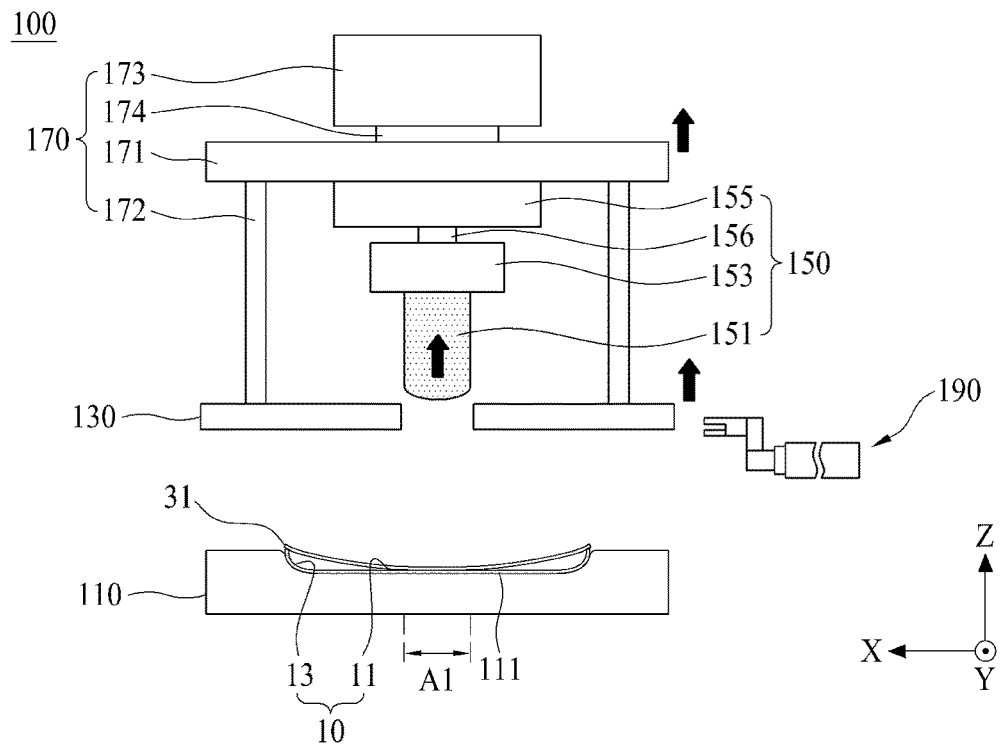

The clamp transfer unit 193 delaminates or peels the protective film PF clamped in the clamp unit 191 from the display panel 31 by horizontally moving the clamp unit 191 in the first direction X. The clamp transfer unit 193 according to one embodiment may include a linear motor, a pneumatic cylinder, or a hydraulic cylinder. Optionally, the clamp transfer unit 193 may be configured to horizontally move the clamp unit 191 in the second direction Y. For example, if the clamp unit 191 clamps the delamination grip of the protective film PF by the horizontal movement and the lifting, the clamp transfer unit 193 moves the clamp unit 191 horizontally in the first direction X so that the protective film PF may be delaminated or peeled from the display panel 31 by the horizontal movement of the clamp unit 191. FIGS. 6A, 6B, and 6C are views illustrating an attachment process of a first attachment portion according to one embodiment of the present disclosure.

The attachment process of the first attachment portion according to one embodiment of the present disclosure will be described with reference to FIGS. 6A to 6C.

The first window supporting stage 110 adsorbs and supports the cover window 10 loaded from the first transfer portion TP1. The panel supporting stage 130 adsorbs and supports the display panel 31 loaded from the first transfer portion TP1 in a state that it raises to a panel loading position in accordance with driving of the stage driving unit 170.

The stage driving unit 170 aligns the position of the display panel 31 supported in the panel supporting stage 130 and the position of the cover window 10 supported in the first window supporting stage 110 by moving the panel supporting stage 130 in the X-axis direction and/or Y-axis direction through driving of the first alignment stage 171.

As shown in FIG. 6A, the film delamination unit 190 clamps the delamination grip provided in the protection film PF of the adhesive sheet attached to the display panel 31 through the clamp unit 191, and delaminates or peels the protective film PF clamped in the clamp unit 191 from the display panel 31 by horizontally moving the clamp unit 191 through driving of the clamp transfer unit 193.

Optionally, the delamination process of the protection film PF may be performed before the alignment process between the display panel 31 and the cover window 10.

As shown in FIG. 6B, the stage driving unit 170 lowers the panel supporting stage 130 to a pre-attachment process position set on the first window supporting stage 110. Subsequently, the first attachment unit 150 pressed or attaches the first adhesive surface A1 of the display panel 31 to one portion of the flat window 11 of the cover window 10 supported in the first window supporting stage 110 through the first pressurizing pad 151 by descending the first pad supporting block 153 through driving of the first pad lifting unit 155. In this case, the first pressurizing pad 151 may press or attach the first adhesive surface A1 of the display panel 31 to one portion of the flat window 11 by pressurizing the rear surface of the display panel 31 overlapped with the first adhesive surface A1 of the display panel 31 supported in the panel supporting stage 130 by passing through the pad through hole 131 of the panel supporting stage 130 in accordance with descending of the first pad supporting block 153. Therefore, the first adhesive surface A1 of the display panel 31 may be pressed or attached to one portion of the flat window 11 by a pressurizing pressure according to elastic deformation of the first pressurizing pad 151.

As shown in FIG. 6C, the panel supporting stage 130 freely drops the adsorbed display panel 31 by releasing vacuum adsorption, whereby an end of the edge adhesive surface of the display panel 31 adsorbed to the panel supporting stage 130 may freely be dropped (e.g., by gravity) onto an end of the curved window 13 of the cover window 10 in accordance with self-weight. In this case, the end of the edge adhesive surface of the display panel 31 may be in contact with the end of the curved window 13 in a non-attachment state, e.g., where at least one curvature portion of the display panel 31 is not yet attached or bonded to the cover window 10.

The stage driving unit 170 raises the panel supporting stage 130 connected to the first alignment stage 171 to a panel unloading position (or home position) of the panel supporting stage 130 connected to the first alignment stage 171. The first attachment unit 150 returns the first pressurizing pad 151 to the home position by raising the first pad supporting block 153 through driving of the first pad lifting unit 155. In this case, the first attachment portion 100 may return the first pressurizing pad 151 to the home position while the panel supporting stage 130 is returning to the home position, to reduce a process time.

FIG. 7 is a view illustrating a second attachment portion according to one embodiment shown in FIG. 4.

Referring to FIG. 7 together with FIG. 4, the second attachment portion 300 according to one embodiment of the present disclosure may include a second window supporting stage 310 and a second attachment unit 350.

The second window supporting stage 310 may support the cover window 10 to which the first adhesive surface A1 of the display panel is attached loaded from the second transfer portion TP2. The second window supporting stage 310 according to one embodiment may include a second window supporting groove 311 corresponding to a 3D shape of the cover window 10 and a plurality of window adsorption holes arranged on the bottom of the second window supporting groove 311. The second window supporting stage 310 may vacuum adsorb the cover window 10 supported in the second window supporting groove 311 through the plurality of window adsorption holes. In this case, the front surface of the cover window 10 may be in contact with the bottom of the second window supporting groove 311, and the display panel 31 attached to one portion of the cover window 10 may face or directly face the second attachment unit 350.

The second attachment unit 350 may press or attach the second adhesive surface A2 of the display panel 31, of which first adhesive surface A1 is attached to one portion of the flat window 11 of the cover window 10, to at least a part of or the entire flat window 11. The second attachment unit 350 according to one embodiment may include a second pressurizing pad 351, a second pad supporting block 353, and a second pad lifting unit 355.

The second pressurizing pad (or second pre-attachment pad) 351 may press or attach the second adhesive surface A2 of the display panel 31, of which first adhesive surface A1 is attached to one portion of the flat window 11 of the cover window 10, to at least a part of or the entire flat window 11.

The second pressurizing pad 351 according to one embodiment may be configured to have a size overlapped with at least a part of or the entire flat window 11. For example, the second pressurizing pad 351 may have a bar shape including a second width W2 and length of the second adhesive surface defined in the display panel 10. An upper surface of the second pressurizing pad 351 may be fixed to the second pad supporting block 353. A lower surface of the second pressurizing pad 351 is a panel pressurizing surface 351a for pressurizing the second adhesive surface A2 of the display panel 31 and may have a convex curved shape.

The second pressurizing pad 351 according to one embodiment may be made of an elastic material at least partially deformed to prevent or mitigate any damage or scratch of the display panel 31 from occurring during a contact with the display panel 31. For example, the second pressurizing pad 351 may include at least one of polymer silicon, urethane rubber, and synthetic resin. The second pressurizing pad 351 made of such an elastic material may pressurize the second adhesive surface A2 of the display panel 31 to at least a part of or the entire flat window 11 while being elastically deformed in accordance with a direct contact with the rear surface of the display panel 31 overlapped with the second adhesive surface A2 of the display panel 31. As another example, the second pressurizing pad 351 may be made of the same elastic material as that of the first pressurizing pad 151 of the first attachment portion 100. The second pressurizing pad 351 may be an elastic pad or elastic deformation pad, but is not limited thereto.

The second pad supporting block (or the second pad stage) 353 may support the second pressurizing pad 351. The second pad supporting block 353 according to one embodiment may include a metal material. For example, the second pad supporting block 353 may include an aluminum material.

The second pad lifting unit 355 may support the second pad supporting block 353 to lift the second pad supporting block 353. The second pad lifting unit 355 according to one embodiment may include a pneumatic cylinder or hydraulic cylinder having a pad lifting axis 356 coupled with the second pad supporting block 353.

The second attachment unit 350 according to one embodiment may further include a first pad shape guide block 357.

The first pad shape guide block (or a first pad shape guider) 357 may be arranged at a lower edge area of the second pad supporting block 353 to surround an upper portion of the second pressurizing pad 351. The first pad shape guide block 357 may prevent or mitigate any deformation of upper portion of the second pressurizing pad 351 from occurring by surrounding upper sides of the second pressurizing pad 351 adjacent to a lower surface of the second pad supporting block 353. Therefore, when the second pressurizing pad 351 pressurizes the display panel 31, a pressurizing surface 351a of the second pressurizing pad 351 and its periphery may elastically be deformed in accordance with a contact with the display panel 31.

The second attachment unit 350 according to one embodiment may further include a coating layer formed on the panel pressurizing surface 351a of the second pressurizing pad 351.

The second attachment portion 300 according to one embodiment of the present disclosure may further include a second alignment stage 371.

The second alignment stage 371 supports the second attachment unit 350, and aligns a position of the second pressurizing pad 351 with a position of the cover window 10 supported in the second window supporting stage 310. For example, the second alignment stage 371 may be coupled with the second pad lifting unit 355 of the second attachment unit 350.

The second alignment stage 371 according to one embodiment may be configured as a UVW stage. The second alignment stage 371 may align the position of the second pressurizing pad 351 with the position of the cover window 10 by moving the second attachment unit 350 in the X-axis direction and/or Y-axis direction. Since the UVW stage has elements known in the art, its detailed description will be omitted.

In some embodiments, if the second pressurizing pad 351 is only lowered or raised on an alignment position set on the second window supporting stage 310, the second alignment stage 371 may be omitted.

Figure 8A:
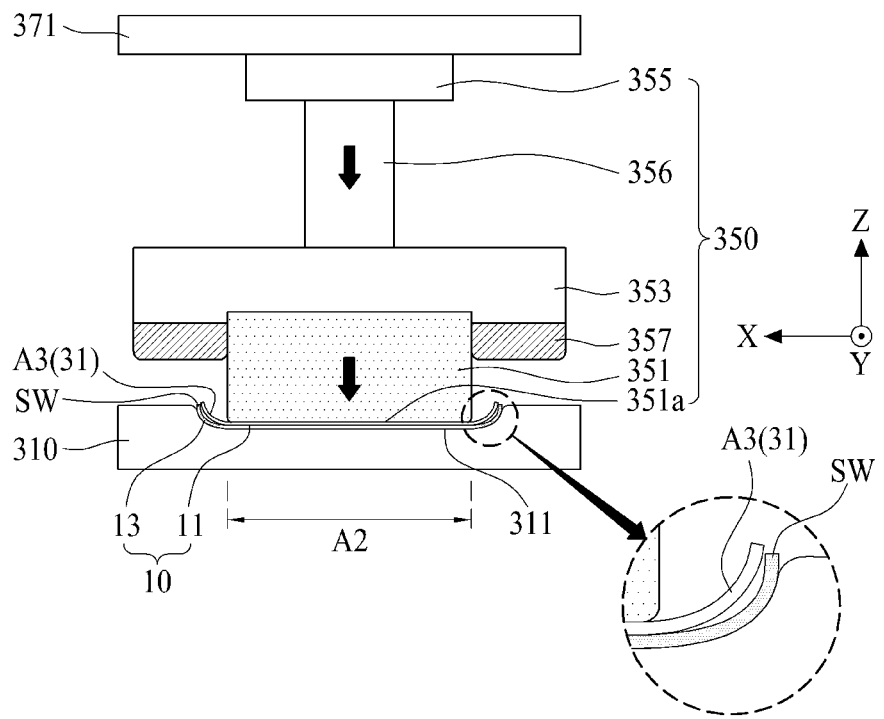
FIGS. 8A and 8B are views illustrating an attachment process of a second attachment portion according to one embodiment of the present disclosure, which is shown in FIG. 7.
Figure 8B:
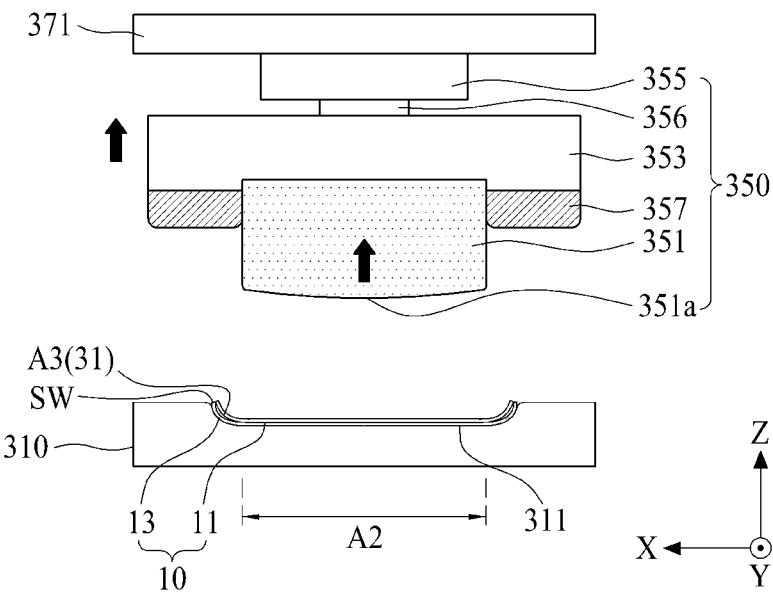

FIGS. 8A and 8B are views illustrating an attachment process of a second attachment portion according to one embodiment of the present disclosure, which is shown in FIG. 7.

The attachment process of the second attachment portion according to one embodiment of the present disclosure will be described with reference to FIGS. 8A and 8B.

The second window supporting stage 310 adsorbs and supports the cover window 10 to which the first adhesive surface A1 of the display panel 31 is attached loaded from the second transfer portion TP2.

The second alignment stage 371 is driven to align the position of the second pressurizing pad 351 with the position of the cover window 10 supported in the second window supporting stage 310 by moving the second pad lifting unit 355 of the second attachment unit 350 in the X-axis direction and/or Y-axis direction.

As shown in FIG. 8A, the second attachment unit 350 presses or attaches the second adhesive surface A2 of the display panel 31 to at least a part of or the entire flat window 11 of the cover window 10 supported in the second window supporting stage 310 through the second pressurizing pad 351 by descending the second pad supporting block 353 through driving of the second pad lifting unit 355. In this case, the second pressurizing pad 351 may press or attach the second adhesive surface A2 of the display panel 31 to at least a part of or the entire flat window 11 by pressurizing the rear surface of the display panel 31 overlapped with the second adhesive surface A2 of the display panel 31 in accordance with descending of the second pad supporting block 353. Therefore, the second adhesive surface A2 of the display panel 31 may be attached to at least a part of or the entire flat window 11 by a pressurizing pressure according to elastic deformation of the second pressurizing pad 351. At this time, the edge adhesive surface of the display panel 31 is not pressurized by the second pressurizing pad 351, the edge adhesive surface is not attached to the curved window 13 of the cover window 10, and the edge end of the display panel 31 may be in contact with the sidewall SW of the curved window 13 in a non-attachment state.

As shown in FIG. 8B, the second attachment unit 350 raises the second pressurizing pad 351 to the panel unloading position (or home position) by raising the second pad supporting block 353 to the home position through driving of the second pad lifting unit 355.

Figure 9:
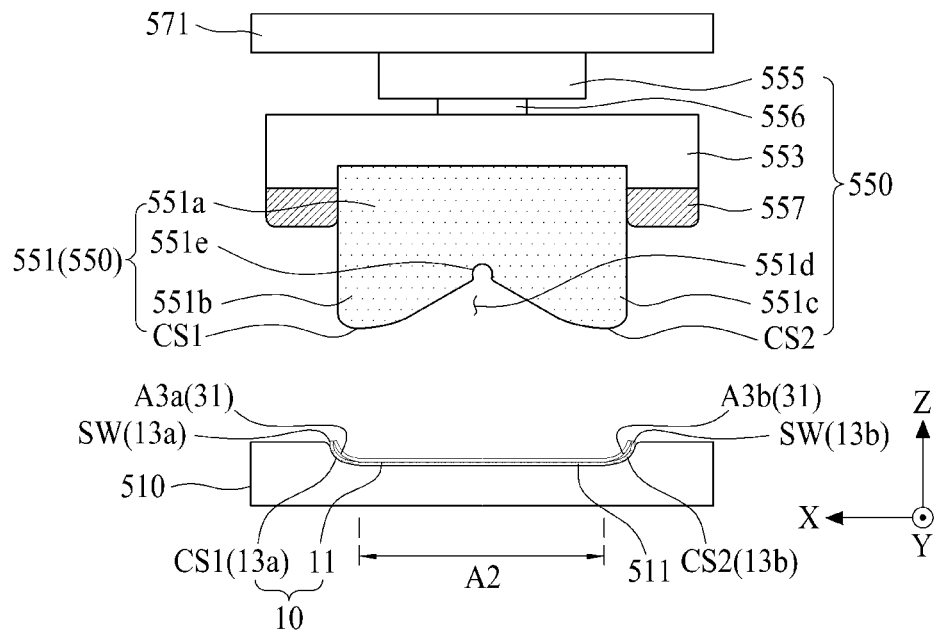
FIG. 9 is a view illustrating a 3D attachment portion according to one embodiment shown in FIG. 4.
Figure 10:
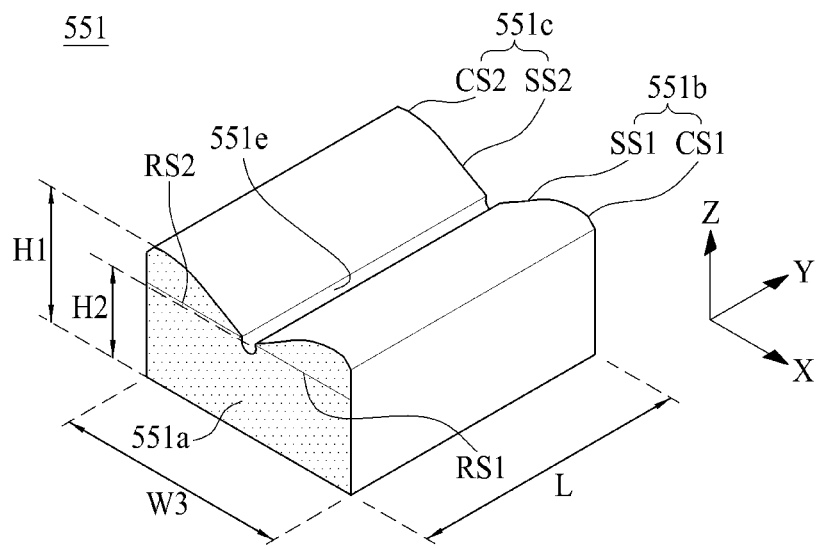
FIG. 10 is a perspective view illustrating a 3D pressurizing pad shown in FIG. 9.

FIG. 9 is a view illustrating a 3D attachment portion according to one embodiment shown in FIG. 4, and FIG. 10 is a perspective view illustrating a 3D pressurizing pad shown in FIG. 9, in which the structure of the 3D pressurizing pad shown in FIG. 7 is modified.

Referring to FIGS. 9 and 10 together with FIGS. 2 to 4, the 3D (three-dimensional) attachment portion (or a third attachment portion) 500 according to one embodiment of the present disclosure may include a window supporting member 510 and a 3D attachment unit 550.

The window supporting member 510 may support the cover window 10 to which the second adhesive surface A2 of the display panel 31 is attached loaded from the third transfer portion TP3. The window supporting member 510 according to one embodiment may include a third window supporting groove 511 corresponding to the 3D shape of the cover window 10 and a plurality of window adsorption holes arranged on the bottom of the third window supporting groove 511. The window supporting member 510 may vacuum adsorb the cover window 10 supported in the third window supporting groove 511 through the plurality of window adsorption holes. In this case, the front surface of the cover window 10 may be in contact with the bottom of the third window supporting groove 511, and the display panel 10 of which other adhesive surface A2 is attached to at least a part of or the entire flat window 11 of the cover window 10 may face or directly face the 3D attachment unit 550.

The 3D attachment unit 550 may press or attach the edge adhesive surface A3 of the display panel (of which second adhesive surface A2 is attached to at least a part of or the entire flat window 11 of the cover window 10) to the curved window 13 of the cover window 10. The 3D attachment unit 550 according to one embodiment may include a 3D pressurizing pad 551, a 3D pad supporting block 553, and a 3D pad lifting unit 555.

The 3D pressurizing pad (or second pre-attachment pad) 551 may press or attach the edge adhesive surface A3 of the display panel 31 (of which second adhesive surface A2 is attached to at least a part of or the entire flat window 11 of the cover window 10) to the curved window 13 of the cover window 10. The 3D pressurizing pad 551 may be made of an elastic material at least partially deformed to prevent or mitigate any damage or scratch of the display panel 31 from occurring during a contact with the display panel 31. For example, the 3D pressurizing pad 551 may include at least one of polymer silicon, urethane rubber, and synthetic resin. The 3D pressurizing pad 551 made of such an elastic material may locally pressurize the edge adhesive surface A3 of the display panel 31 to the curved window 13 while being elastically deformed in accordance with a direct contact with the edge portion (or bending display portion) of the display panel 31 overlapped with the edge adhesive surface A3 of the display panel 31. As another example, the 3D pressurizing pad 551 may be made of the same elastic material as that of the first pressurizing pad 151 of the first attachment portion 100 and/or the second pressurizing pad 351 of the second attachment portion 300.

The second pressurizing pad 551 according to one embodiment may include a pad body 551a, a first pressurizing portion 551b, and a second pressurizing portion 551c.

The pad body 551a may be configured to have a size overlapped with the inner surface of the cover window 10. For example, the pad body 551a may have a plate shape having a third width W3 corresponding to a distance between the first curved portion 13a and the second curvature portion 13b of the cover window 10 and a length L corresponding to a long-side length of the cover window 10.

The first pressurizing portion 551b may be protruded from a rear side RS1 of the pad body 551a to have a varying thickness (e.g., an asymmetrical structure up and down from side to side based on the first direction X) and may pressure one side edge (or one side edge adhesive surface) of the display panel 31 to the first curved portion 13a of the cover window 10. The first pressurizing portion 551b may not pressure the other side edge or the first adhesive surface of the display panel 31.

The first pressurizing portion 551b according to one embodiment may include a first convex surface CS1 and a first slope surface SS1. The first pressurizing portion 551b may have a triangular (e.g., a right-angled triangle) cross-sectional structure having the first convex surface CS1 as a vertex and the first slope surface SS1 as an oblique side. For example, the first pressurizing portion 551b may have a right-angled triangle sectional structure, on the basis of a second plane configured by the first direction X and a height direction Z, with the projection of first convex surface CS1 on the second plane as a vertex and the projection of the first slope surface SS1 on the second plane as an oblique.

The first convex surface CS1 may include a curved shape corresponding to a curved shape of the curved portion CP that forms the first curvature portion 13a of the cover window 10. As an example, the first convex surface CS1 may have a curved shape section having at least one curvature. For example, the projection of the first convex surface CS1 on the second plane may have a curved shape section having at least one curvature. As another example, the first convex surface CS1 may have a concentric circle shaped section with the curved portion CP of the first curvature portion 13a. For example, the projection of the first convex surface CS1 on the second plane may have a concentric circle shape with the projection of the curved portion CP of the first curvature portion 13a on the second plane when the first convex surface CS1 is in contact with the curved portion CP. Thus, the first convex surface CS1 may locally pressurize one side edge of the display panel 31 to the first curvature portion 13a and therefore press or attach one edge adhesive surface A3a of the display panel 31 to the first curvature portion 13a of the cover window 10.

The first slope surface SS1 may be formed with a slope between the first convex surface CS1 and a middle portion of the pad body 551a. The first slope surface SS1 may be formed with a slope between the first convex surface CS1 and the pad body 551a such that a pressurizing force of the first pressurizing portion 551b may locally be transferred to one side edge of the display panel 31 (and not the other side edge or the first adhesive surface of the display panel 31) through the first convex surface CS1.

The second pressurizing portion 551c may be protruded from the other rear side RS2 of the pad body 551a to have a varying thickness (e.g., an asymmetrical structure up and down from side to side based on the first direction X) and may pressure another side edge (or one side edge adhesive surface) of the display panel 31 to the second curvature portion 13b of the cover window 10. The second pressurizing portion 551c may not pressure the side edge (pressed by the first pressurizing portion 551b) or the first adhesive surface of the display panel 31.

The second pressurizing portion 551c according to one embodiment may include a second convex surface CS2 and a second slope surface SS2. The second pressurizing portion 551c may have a triangular (e.g., a right-angled triangle) cross-sectional structure having the second convex surface CS2 as a vertex and the second slope surface SS2 as an oblique side. For example, the second pressurizing portion 551c may have a right-angled triangle sectional structure, on the basis of the second plane with the projection of second convex surface CS2 on the second plane as a vertex and the projection of the second slope surface SS2 on the second plane as an oblique. The second pressurizing portion 551c may be configured to have a symmetrical structure with the first pressurizing portion 551b across an axis of symmetry through the middle portion of the pad body 551a.

The second convex surface CS2 may include a curved shape corresponding to a curved shape of the curved portion CP that forms the second curvature portion 13b of the cover window 10. As an example, the second convex surface CS2 may have a curved shape section having at least one curvature. For example, the projection of the second convex surface CS2 on the second plane may have a curved shape section having at least one curvature. As another example, the second convex surface CS2 may have a concentric circle shaped section with the curved portion CP of the second curvature portion 13b. For example, the projection of the second convex surface CS2 on the second plane may have a concentric circle shape with the projection of the curved portion CP of the second curvature portion 13b on the second plane when the second convex surface CS2 is in contact with the curved portion CP. Thus, second convex surface CS2 may locally pressurize another side edge of the display panel 31 to the second curvature portion 13b and therefore press or attach another edge adhesive surface A3b of the display panel 31 to the second curvature portion 13b of the cover window 10.

The second slope surface SS2 may be formed with a slope between the second convex surface CS2 and the middle portion of the pad body 551a. The second slope surface SS2 may be formed with a slope between the second convex surface CS2 and the middle portion of the pad body 551a such that a pressurizing force of the second pressurizing portion 551c may locally be transferred to another side edge of the display panel 31 (and not the side edge pressed by the first pressurizing portion 551b or the first adhesive surface of the display panel 31) through the second convex surface CS2.

The 3D pressurizing pad 551 according to one embodiment may further include a groove portion 551d between the first pressurizing portion 551b and the second pressurizing portion 551c.

The groove portion 551d may be formed to have a triangle shaped cross-sectional structure or "V" shaped cross-sectional structure between the first pressurizing portion 551b and the second pressurizing portion 551c. For example, the groove portion 551d may have a triangle shaped sectional structure or "V" shaped sectional structure, on the basis of the second plane, with the first pressurizing portion 551b having the first convex surface CS1 and the first slope surface SS1 on the second plane as a first oblique and the second pressurizing portion 551c having the second convex surface CS2 and the second slope surface SS2 on the second plane as a second oblique. A cross-sectional area of the groove portion 551d may gradually be reduced toward the pad body 551a. The groove portion 551d may provide a space for elastic deformation of each of the first pressurizing portion 551b and the second pressurizing portion 551c when each of the first pressurizing portion 551b and the second pressurizing portion 551c pressurizes the edge adhesive surfaces A3a and A3b, respectively, of the display panel 31.

The 3D pressurizing pad 551 according to one embodiment may further include a slit 551e arranged on the middle portion of the pad body 551a and formed to be recessed from the groove portion 551d.

The slit 551e may be formed to be recessed between one side end of the first pressurizing portion 551b and one side end of the second pressurizing portion 551c. The slit 551e may be formed to be recessed to have a certain size from a rear surface of the pad body 551a where ends of the first slope surface SS1 of the first pressurizing portion 551b and the second slope surface SS2 of the second pressurizing portion 551c meet.

Figure 13:
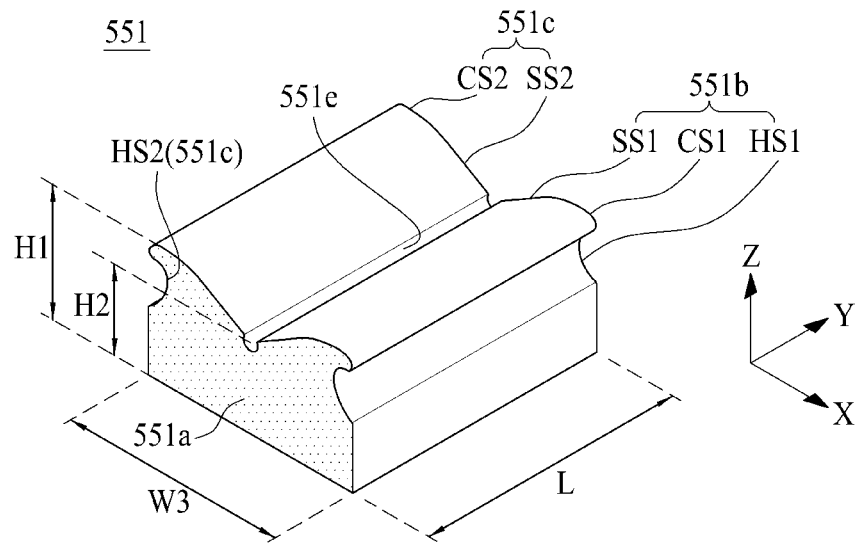
FIG. 13 is a perspective view illustrating a 3D pressurizing pad shown in FIG. 12.

The slit 551e according to one embodiment may have a semi-circular shaped cross-sectional structure of which one side is communicated with the groove portion 551d. For example, the slit 551e may include an arc shape having a first curvature radius of 1.5 mm. As shown in the embodiment of FIG. 13, the center of the slit 551e may be arranged at ⅔ height H2 of a height H1 of the 3D pressurizing pad 551, based on the upper surface of the 3D pressurizing pad 551.

The slit 551e may be formed between the first pressurizing portion 551b and the second pressurizing portion 551c overlapped with the middle portion of the pad body 551a in the first direction X to prevent the pressurizing force of the 3D pressurizing pad 551 from being concentrated on any one of the first pressurizing portion 551b and the second pressurizing portion 551c. Also, the slit 551e may provide a space where the ends of the first pressurizing portion 551b and the second pressurizing portion 551c may elastically be deformed when the 3D pressurizing pad 551 is elastically deformed. In this case, if the slit 551e does not exist between the ends of the first pressurizing portion 551b and the second pressurizing portion 551c, lifespan of the 3D pressurizing pad 551 may be reduced due to damage of the 3D pressurizing pad 551 resulting from a physical contact or overlap between the ends of the first pressurizing portion 551b and the second pressurizing portion 551c when the 3D pressurizing pad 551 is elastically deformed. Optionally, the slit 551e may be expressed as an eccentric prevention member.

The 3D pad supporting block (or the second pad stage) 553 may support the 3D pressurizing pad 551. The 3D pad supporting block 553 according to one embodiment may include a metal material. For example, the 3D pad supporting block 553 may include an aluminum material.

The 3D pad lifting unit 555 may support the 3D pad supporting block 553 to lift the 3D pad supporting block 553. The 3D pad lifting unit 555 according to one embodiment may include a pneumatic cylinder or hydraulic cylinder having a pad lifting axis 556 coupled with the 3D pad supporting block 553.

The 3D attachment unit 550 according to one embodiment may further include a second pad shape guide block 557.

The second pad shape guide block (or a second pad shape guider) 557 may be arranged at a lower edge area of the 3D pad supporting block 553 to surround an upper portion of the 3D pressurizing pad 551. The second pad shape guide block 557 may prevent or mitigate deformation of upper portion of the 3D pressurizing pad 551 from occurring by surrounding upper sides of the 3D pressurizing pad 551 adjacent to a lower surface of the 3D pad supporting block 553. Therefore, when the 3D pressurizing pad 551 pressurizes the display panel 31, pressurizing portions 551b and 551c of the 3D pressurizing pad 551 and periphery may elastically be deformed in accordance with a contact with the display panel 31.

The 3D attachment unit 550 according to one embodiment may further include a coating layer formed on the 3D pressurizing pad 551.

The 3D attachment portion 500 according to one embodiment of the present disclosure may further include a third alignment stage 571.

The third alignment stage 571 supports the 3D attachment unit 550 and aligns a position of the 3D pressurizing pad 551 with a position of the cover window 10 supported in the window supporting member 510. For example, the third alignment stage 571 may be coupled with the 3D pad lifting unit 555 of the 3D attachment unit 550.

The 3D alignment stage 571 according to one embodiment may be configured as a UVW stage. The third alignment stage 571 may align the position of the 3D pressurizing pad 551 with the position of the cover window 10 by moving the 3D attachment unit 550 in the X-axis direction and/or Y-axis direction. Since the UVW stage has elements known to one skilled in the art, its detailed description will be omitted.

In some embodiments, if the 3D pressurizing pad 551 is only lowered or raised on an alignment position set on the window supporting stage 510, the third alignment stage 571 may be omitted.

Figure 11A:
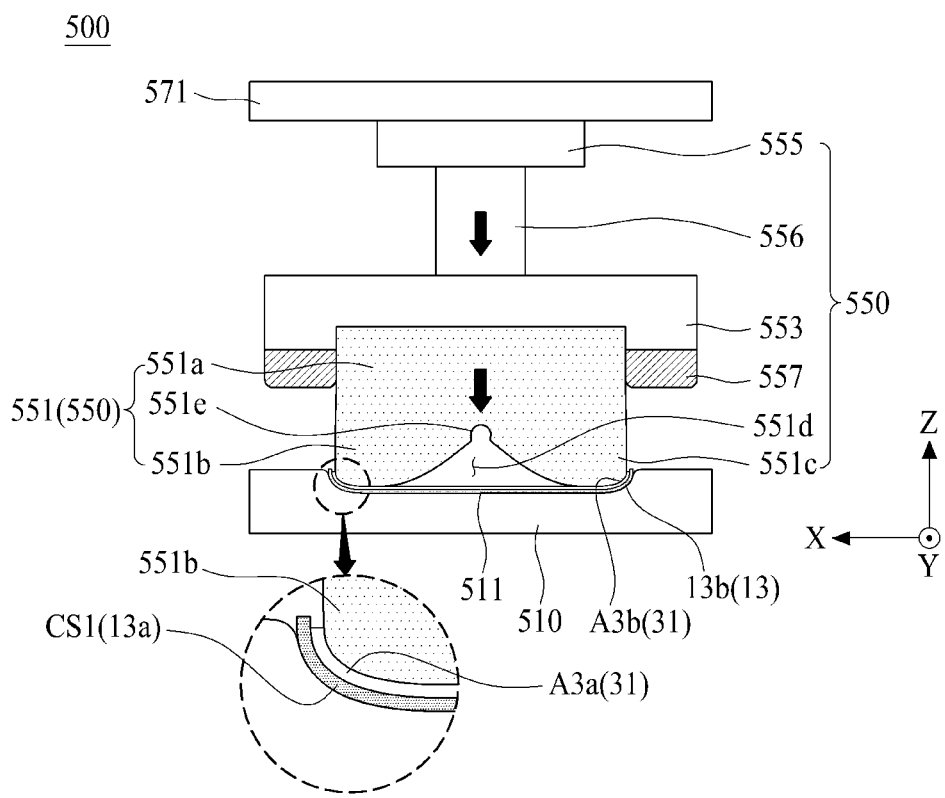
FIGS. 11A and 11B are views illustrating an attachment process of a 3D attachment portion according to one embodiment of the present disclosure, which is shown in FIGS. 9 and 10.
Figure 11B:
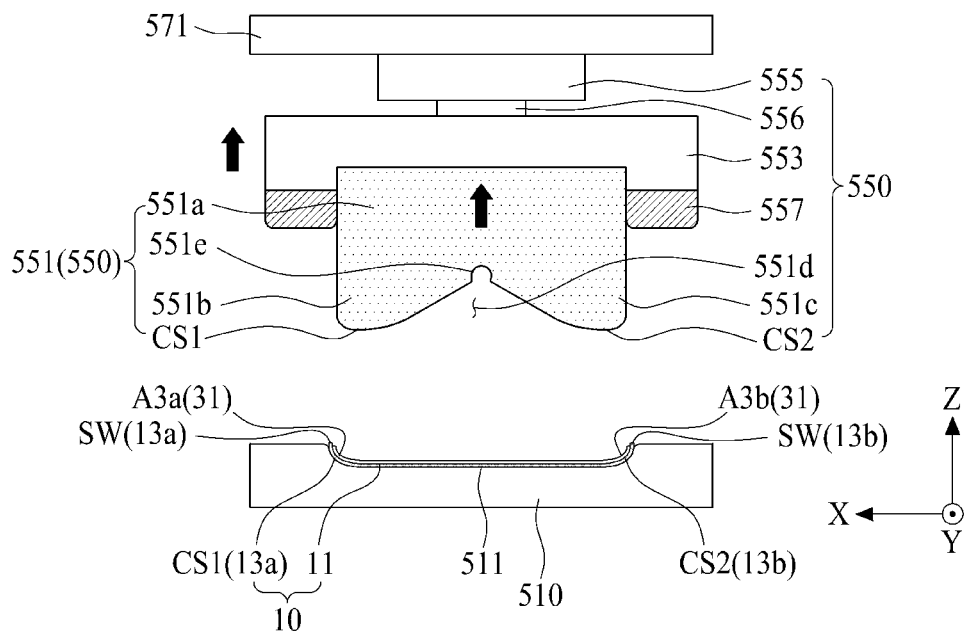

FIGS. 11A and 11B are views illustrating an attachment process of a 3D attachment portion according to one embodiment of the present disclosure, which is shown in FIGS. 9 and 10.

The attachment process of the 3D attachment portion according to one embodiment of the present disclosure will be described with reference to FIGS. 11A and 11B.

The window supporting member 510 adsorbs and supports the cover window 10 to which the second adhesive surface A2 of the display panel 31 is attached loaded from the third transfer portion TP3.

The third alignment stage 571 is driven to align the position of the 3D pressurizing pad 551 and the position of the cover window 10 supported in the window supporting member 510 by moving the 3D pad lifting unit 555 of the 3D attachment unit 550 in the X-axis direction and/or Y-axis direction.

As shown in FIG. 11A, the 3D attachment unit 550 presses or attaches the edge adhesive surfaces A3a and A3b of the display panel 31 to at least a part of or the entire curved window 13 of the cover window 10 supported in the window supporting member 510 through the 3D pressurizing pad 551 by descending the 3D pad supporting block 553 through driving of the 3D pad lifting unit 555. In this case, the first pressurizing portion 551b of the 3D pressurizing pad 351 may be overlapped with one edge adhesive surface A3a of the display panel 31 in accordance with descending of the 3D pad supporting block 553. The first pressurizing portion 551b may elastically be deformed in accordance with a physical contact with one edge of the display panel 31 due to overlap between the first pressurizing portion 551b and the adhesive surface A3a. The first pressurizing portion 551b may press or attach one edge adhesive surface A3a of the display panel 31 to the first curvature portion 13a of the curved window 13 by locally pressurizing one edge adhesive surface A3a of the display panel 31 due to elastic deformation. At the same time, the second pressurizing portion 551c of the 3D pressurizing pad 551 may be overlapped with another edge adhesive surface A3b of the display panel 31 in accordance with descending of the 3D pad supporting block 553. The second pressurizing portion 551c may elastically be deformed in accordance with a physical contact with another edge of the display panel 31 due to overlap between the second pressurizing portion 551c and the adhesive surface A3b. The second pressurizing portion 551c may attach another edge adhesive surface A3b of the display panel 31 to the second curvature portion 13b of the curved window 13 by locally pressurizing another edge adhesive surface A3b of the display panel 31 due to elastic deformation. At this time, the first pressurizing portion 551b of the 3D pressurizing pad 551 may elastically be deformed to the same 3D shape as that of the first curvature portion 13a by the groove portion 551d and the slit 551e. Likewise, the second pressurizing portion 551c of the 3D pressurizing pad 551 may elastically be deformed to the same 3D shape as that of the second curvature portion 13b by the groove portion 551d and the slit 551e. Therefore, the edge adhesive surfaces A3a and A3b of the display panel 31 may be pressed or attached to each of the first curvature portion 13a and the second curvature portion 13b of the curved window 13, respectively, by a local pressurizing pressure according to elastic deformation of each of the first pressurizing portion 551b and the second pressurizing portion 551c of the 3D pressurizing pad 551, respectively.

As shown in FIG. 11B, the 3D attachment unit 550 raises the 3D pressurizing pad 551 to the panel unloading position (or home position) by raising the 3D pad supporting block 553 to the home position through driving of the 3D pad lifting unit 555.

The window supporting member 510 releases vacuum adsorption for the cover window 10 bonded to the display panel 31. Therefore, the cover window 10 supported in the window supporting member 510 and bonded to the display panel 31 may be unloaded from the 3D attachment portion 500 by the fourth transfer portion TP4, whereby the display panel 31 and the cover window 10 may be bonded.

Figure 12:
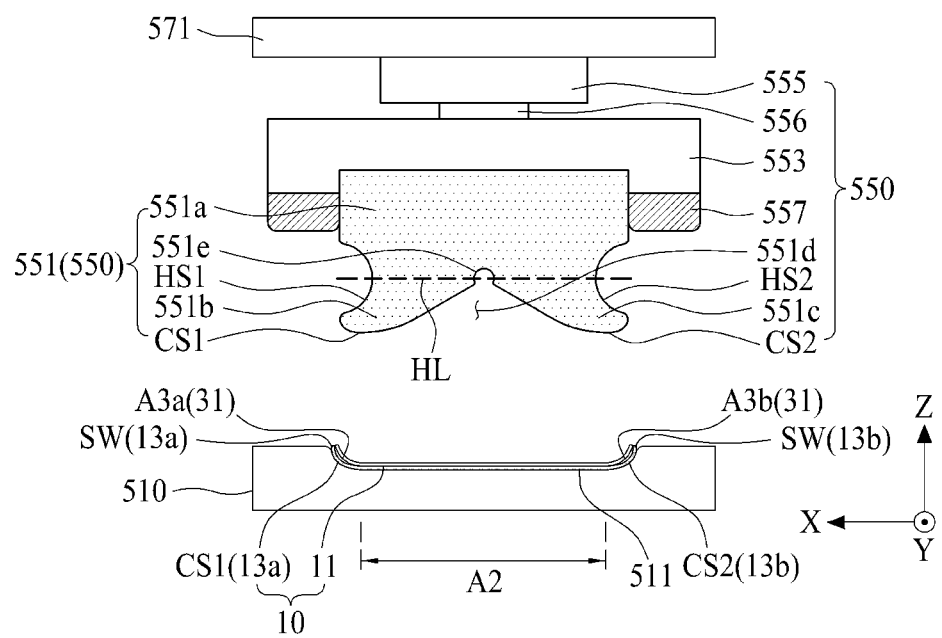
FIG. 12 is a view illustrating a 3D attachment portion according to another embodiment shown in FIG. 4.

FIG. 12 is a view illustrating a 3D attachment portion according to another embodiment shown in FIG. 4, and FIG. 13 is a perspective view illustrating a 3D pressurizing pad shown in FIG. 12, in which the structure of the 3D pressurizing pad shown in FIGS. 9 and 10 is modified. Therefore, in the following description, repeated description of the other elements except the 3D pressurizing pad and its related elements will be omitted.

Referring to FIGS. 12 and 13 together with FIGS. 2 to 4, in the 3D pressurizing pad 551 of the 3D attachment portion 500 according to another embodiment of the present disclosure, the first pressurizing portion 551b may further include a first hollow surface HS1.

The first hollow surface HS1 may be formed to be recessed between one side end of the pad body 551a and one end of the first convex surface CS1.

The first hollow surface HS1 according to one embodiment may have a semi-circle shaped cross-sectional structure recessed from an outer side of the first pressurizing portion 551b adjacent to one side end of the pad body 551a. The first hollow surface HS1 may provide a space between one side end of the pad body 551a and the first convex surface CS1. The first hollow surface HS1 according to another embodiment may include an arc shape having a second curvature radius greater than the first curvature radius of the slit 551e. In this case, a horizontal line HL extended from the center of the first hollow surface HS1 of the arc shape may pass through the center of the slit 551e. Therefore, the first convex surface CS1 may be locally and elastically deformed to have the same curved shape as that of the first curvature portion 13a of the curved window 13.

For this reason, the pressurizing force of the first pressurizing portion 551b may locally be transferred to one edge adhesive surface A3a (and not another edge adhesive surface A3b) of the display panel 31, whereby uniform bonding between the first curvature portion 13a of the cover window 10 and one edge adhesive surface A3a of the display panel 31 may be made.

In the 3D pressurizing pad 551 of the 3D attachment portion 500 according to another embodiment of the present disclosure, the second pressurizing portion 551c may further include a second hollow surface HS2.

The second hollow surface HS2 may be formed to be recessed between the other side end of the pad body 551a and one end of the second convex surface CS2.

The second hollow surface HS2 according to one embodiment may have a semi-circle shaped cross-sectional structure recessed from an outer side of the second pressurizing portion 551b adjacent to the other side end of the pad body 551a. The second hollow surface HS2 may provide a space between the other side end of the pad body 551a and the second convex surface CS2. The second hollow surface HS2 according to another embodiment may include an arc shape having a second curvature radius greater than the first curvature radius of the slit 551e. In this case, a horizontal line HL extended from the center of the second hollow surface HS2 of the arc shape may pass through the center of the slit 551e. Therefore, the second convex surface CS2 may be locally and elastically deformed to have the same curved shape as that of the second curvature portion 13b of the curved window 13. For this reason, the pressurizing force of the second pressurizing portion 551c may locally be transferred to another edge adhesive surface A3b (and not edge adhesive surface A3a) of the display panel 31, whereby uniform bonding between the second curvature portion 13b of the cover window 10 and another edge adhesive surface A3b of the display panel 31 may be made.

In the 3D pressurizing pad 551 according to this embodiment described as above, the first pressurizing portion 551b and the second pressurizing portion 551c may be configured to have a "V" shaped cross-sectional structure of which sides are recessed, while having a symmetrical structure across an axis of symmetry through the middle portion of the pad body 551a.

Figure 14A:
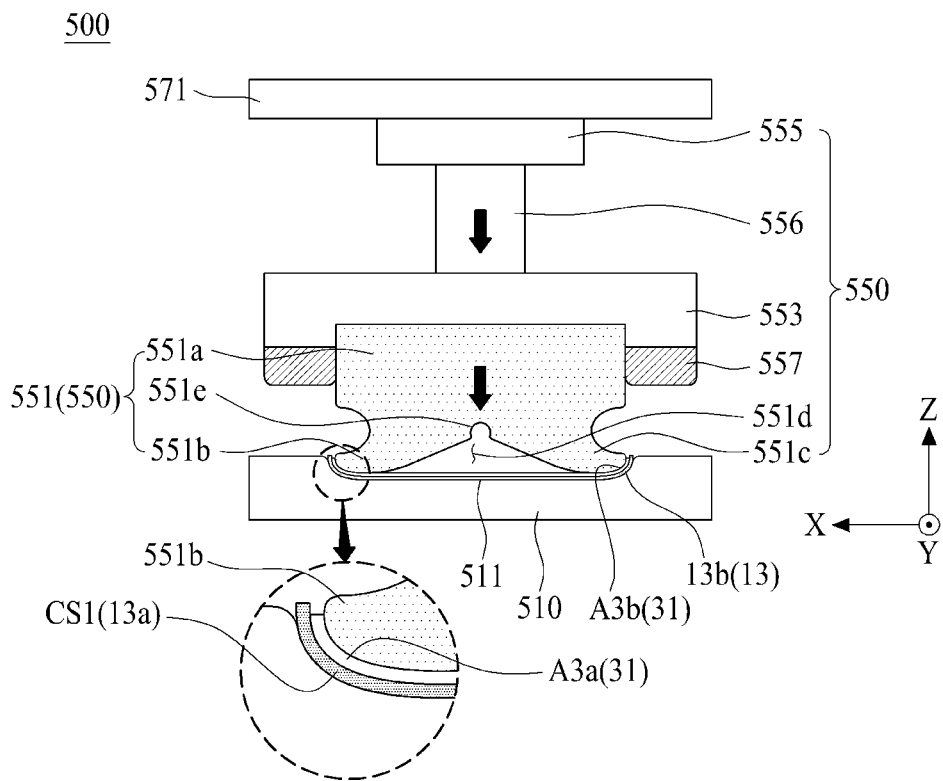
FIGS. 14A and 14B are views illustrating an attachment process of a 3D attachment portion according to another embodiment of the present disclosure, which is shown in FIGS. 12 and 13.
Figure 14B:
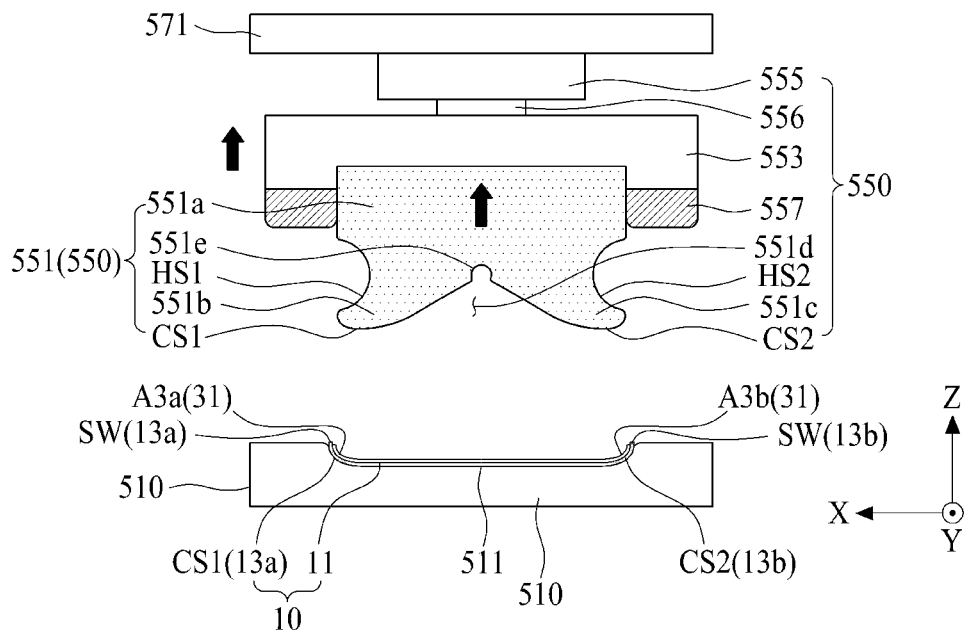

FIGS. 14A and 14B are views illustrating an attachment process of a 3D attachment portion according to another embodiment of the present disclosure, which is shown in FIGS. 12 and 13.

The attachment process of the 3D attachment portion according to another embodiment of the present disclosure will be described with reference to FIGS. 14A and 14B together with FIGS. 12 and 13.

The window supporting member 510 adsorbs and supports the cover window 10 to which the second adhesive surface A2 of the display panel 31 loaded from the third transfer portion TP3 is attached.

The third alignment stage 571 is driven to align the position of the 3D pressurizing pad 551 and the position of the cover window 10 supported in the window supporting member 510 by moving the 3D pad lifting unit 555 of the 3D attachment unit 550 in the X-axis direction and/or Y-axis direction.

As shown in FIG. 14A, the 3D attachment unit 550 presses or attaches the edge adhesive surfaces A3a and A3b of the display panel 31 to at least a part of or the entire curved window 13 of the cover window 10 supported in the window supporting member 510 through the 3D pressurizing pad 551 by descending the 3D pad supporting block 553 through driving of the 3D pad lifting unit 555. In this case, the first pressurizing portion 551b of the 3D pressurizing pad 551 may elastically be deformed in accordance with a physical contact with one edge of the display panel 31 overlapped with one edge adhesive surface A3a of the display panel 31 in accordance with descending of the 3D pad supporting block 553. For this reason, the first pressurizing portion 551b may attach one edge adhesive surface A3a of the display panel 31 to the first curvature portion 13a of the curved window 13 by locally pressurizing one edge adhesive surface A3a of the display panel 31. At the same time, the second pressurizing portion 551c of the 3D pressurizing pad 551 may elastically be deformed in accordance with a physical contact with another edge of the display panel 31 overlapped with another edge adhesive surface A3b of the display panel 31 in accordance with descending of the 3D pad supporting block 553. For this reason, the second pressurizing portion 551c may attach another edge adhesive surface A3b of the display panel 31 to the second curvature portion 13b of the curved window 13 by locally pressurizing another edge adhesive surface A3b of the display panel 31. At this time, the first pressurizing portion 551b of the 3D pressurizing pad 551 may elastically be deformed to the same 3D shape as that of the first curvature portion 13a by the groove portion 551d, the slit 551e, and the first hollow surface HS1. Likewise, the second pressurizing portion 551c of the 3D pressurizing pad 551 may elastically be deformed to the same 3D shape as that of the second curvature portion 13b by the groove portion 551d, the slit 551e, and the second hollow surface HS2. Therefore, the edge adhesive surface A3 of the display panel 31 may be pressed or attached to each of the first curvature portion 13a and the second curvature portion 13b of the curved window 13 by a local pressurizing pressure according to elastic deformation of each of the first pressurizing portion 551b and the second pressurizing portion 551c of the 3D pressurizing pad 551, respectively.

As shown in FIG. 14B, the 3D attachment unit 550 raises the 3D pressurizing pad 551 to the panel unloading position (or home position) by raising the 3D pad supporting block 553 to the home position through driving of the 3D pad lifting unit 555.

The window supporting member 510 releases vacuum adsorption for the cover window 10 bonded to the display panel 31. Therefore, the cover window 10 supported in the window supporting member 510 and bonded to the display panel 31 may be unloaded from the 3D attachment portion 500 by the fourth transfer portion TP4, whereby the display panel 31 and the cover window 10 may be bonded.

Figure 15:
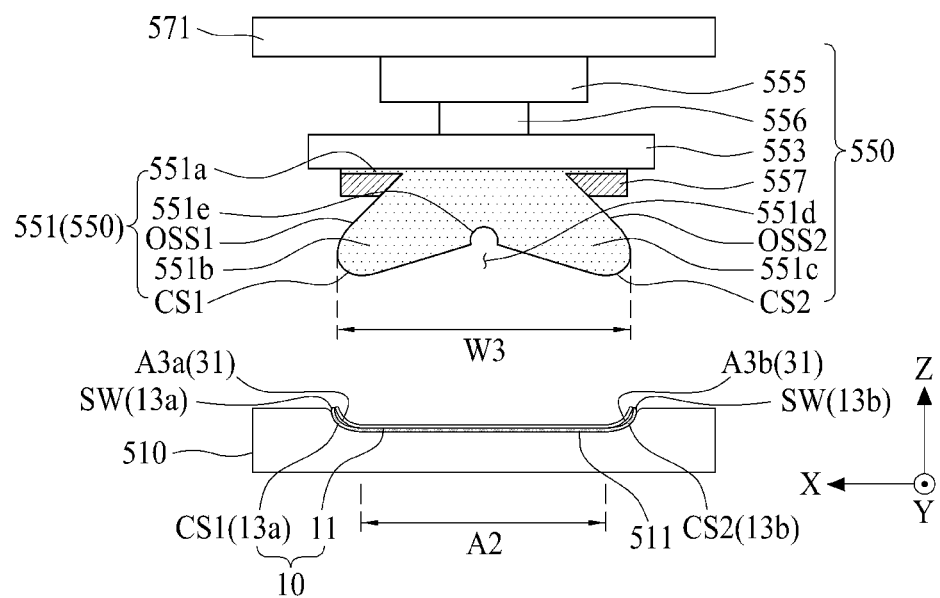
FIG. 15 is a view illustrating a 3D attachment portion according to other embodiment shown in FIG. 4.
Figure 16:
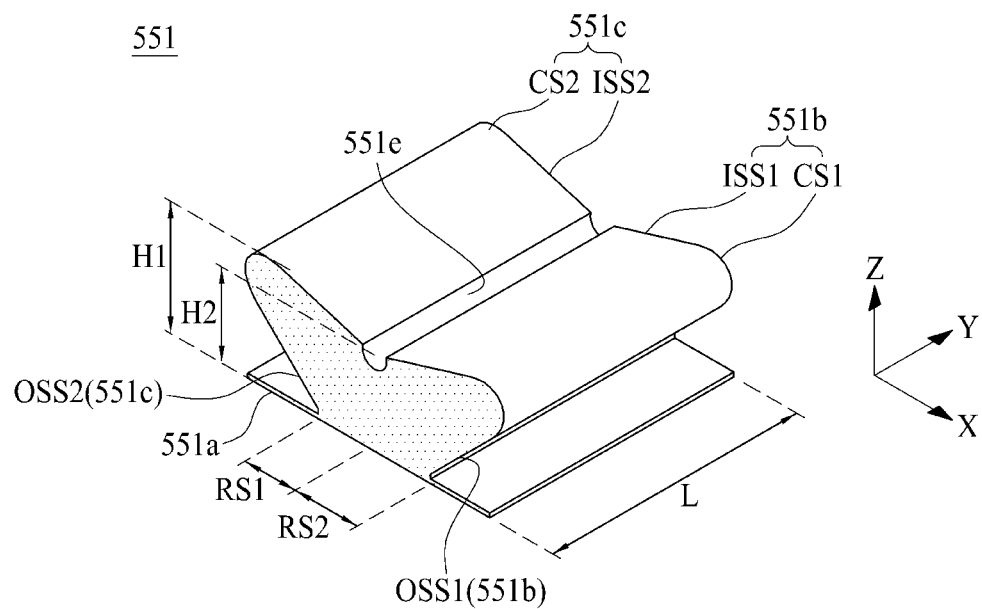
FIG. 16 is a perspective view illustrating a 3D pressurizing pad shown in FIG. 15.

FIG. 15 is a view illustrating a 3D attachment portion according to other embodiment shown in FIG. 4, and FIG. 16 is a perspective view illustrating a 3D pressurizing pad shown in FIG. 15, in which the structure of the 3D pressurizing pad shown in FIGS. 9 and 10 is modified. Therefore, in the following description, repeated description of the other elements except the 3D pressurizing pad and its related elements will be omitted.

Referring to FIGS. 15 and 16 together with FIGS. 2 to 4, the 3D pressurizing pad 551 of the 3D attachment portion 500 according to another embodiment of the present disclosure may further include a pad body 551a, a first pressurizing portion 551b, and a second pressurizing portion 551c.

The pad body 551a may be configured to have a size overlapped with the inner surface of the cover window 10. For example, the pad body 551a may have a plate shape having a third width W3 corresponding to a distance between the first curved portion 13a and the second curvature portion 13b of the cover window 10 and a length L corresponding to a long side length of the cover window 10.

The first pressurizing portion 551b may be protruded from a rear side RS1 of the pad body 551a to have a varying thickness (e.g., an asymmetrical structure up and down from side to side based on the first direction X) and may pressure one side edge (or one side edge adhesive surface) of the display panel 31 to the first curved portion 13a of the cover window 10. The first pressurizing portion 551b may not pressure the other side edge or the first adhesive surface of the display panel 31.

The first pressurizing portion 551b according to one embodiment may include a first convex surface CS1, a first inner slope surface ISS1, and a first outer slope surface OSS1. For example, the first pressurizing portion 551b may be slanted and protruded from the rear side RS1 of the pad body 551a to the first curvature portion 13a of the cover window 10.

The first convex surface CS1 may include a curved shape corresponding to a curved shape of the curved portion CP that forms the first curvature portion 13a of the cover window 10. As an example, the first convex surface CS1 may have a curved shape section having at least one curvature. As another example, the first convex surface CS1 may have a concentric circle shaped section with the curved portion CP of the first curvature portion 13a. The first convex surface CS1 may locally pressurize one side edge of the display panel 31 to the first curvature portion 13a and therefore press or attach one edge adhesive surface A3a of the display panel 31 to the first curvature portion 13a of the cover window 10.

The first inner slope surface ISS1 may be formed with a slope between the first convex surface CS1 and the middle portion of the rear surface of the pad body 551a. The first inner slope surface ISS1 may be formed with a slope between the first convex surface CS1 and the middle portion of the pad body 551a such that a pressurizing force of the first pressurizing portion 551b may locally be transferred to one side edge of the display panel 31 (and not the other side edge or the first adhesive surface of the display panel 31) through the first convex surface CS1.

The first outer slope surface OSS1 may be formed with a slope between an end of the rear side RS1 of the middle portion of the pad body 551a and one end of the first convex surface CS1. The first outer slope surface OSS1 may be included within the range of 35° to 60° with respect to the rear surface of the pad body 551a. That is, an angle between the first outer slope surface OSS1 and the rear surface of the pad body 551a may range from 35° to 60°. For example, the angle between the first outer slope surface OSS1 and the rear surface of the pad body 551a may be set to 45° such that the pressurizing force of the first convex surface CS1 may be transferred to the curved portion CP of the first curvature portion 13a.

The second pressurizing portion 551c may be protruded from the other rear side RS2 of the pad body 551a to have a varying thickness (e.g., an asymmetrical structure up and down from side to side based on the first direction X) and may pressure another side edge (or another side edge adhesive surface) of the display panel 31 to the second curvature portion 13b of the cover window 10. The second pressurizing portion 551c may not pressure the side edge (pressed by the first pressurizing portion 551b) or the first adhesive surface of the display panel 31.

The second pressurizing portion 551c according to one embodiment may include a second convex surface CS2, a second inner slope surface ISS2 and a second outer slope surface OSS2. For example, the second pressurizing portion 551c may be slanted and protruded from the other rear side RS2 of the middle portion of the pad body 551a to the second curvature portion 13b of the cover window 10. The second pressurizing portion 551c may be configured to have a symmetrical structure with the first pressurizing portion 551b across an axis of symmetry through the middle portion of the pad body 551a. Therefore, the first pressurizing portion 551b and the second pressurizing portion 551c may be configured to have a "V" shaped cross-sectional structure having a symmetrical structure across the axis of symmetry. In this case, the "V" shaped sectional structure of the first pressurizing portion 551b and the "V" shaped sectional structure of the second pressurizing portion 551c are symmetrical to each other based on the middle portion of the pad body 551a based on the first direction X (e.g., across a plane of symmetry in the Y and Z directions).

The second convex surface CS2 may include a curved shape corresponding to a curved shape of the curved portion CP that forms the second curvature portion 13b of the cover window 10. As an example, the second convex surface CS2 may have a curved shape section having at least one curvature. As another example, the second convex surface CS2 may have a concentric circle shaped section with the curved portion CP of the second curvature portion 13b. The second convex surface CS2 may locally pressurize another side edge of the display panel 31 to the second curvature portion 13b and therefore press or attach another edge adhesive surface A3b of the display panel 31 to the second curvature portion 13b of the cover window 10.

The second inner slope surface ISS2 may be formed with a slope between the second convex surface CS2 and the middle portion of the pad body 551a. The second inner slope surface ISS2 may be formed with a slope between the second convex surface CS2 and the middle portion of the pad body 551a such that a pressurizing force of the second pressurizing portion 551c may locally be transferred to another side edge of the display panel 31 (and not the side edge pressured by the first pressurizing portion 551b or the first adhesive surface of the display panel 31) through the second convex surface CS2.

The second outer slope surface OSS2 may be formed with a slope between an end of the other rear side RS2 of the middle portion of the pad body 551a and one end of the second convex surface CS2. An angle between the second outer slope surface OSS2 and the rear surface of the pad body 551a may range from 35° to 60°. For example, the angle between the second outer slope surface OSS2 and the rear surface of the pad body 551a may be set to 45° such that the pressurizing force of the second convex surface CS2 may be transferred to the curved portion CP of the second curvature portion 13b.

The 3D pressurizing pad 551 according to one embodiment may further include a groove portion 551d between the first pressurizing portion 551b and the second pressurizing portion 551c.

The groove portion 551d may be formed to have a triangle shaped cross-sectional structure or "V" shaped cross-sectional structure between the first inner slope surface ISS1 of the first pressurizing portion 551b and the second inner slope surface ISS2 of the second pressurizing portion 551c. A cross-sectional area of the groove portion 551d may gradually be reduced toward the pad body 551a. The groove portion 551d may provide a space for elastic deformation of each of the first pressurizing portion 551b and the second pressurizing portion 551c when each of the first pressurizing portion 551b and the second pressurizing portion 551c pressurizes the edge adhesive surfaces A3a and A3b of the display panel 31, respectively.

The 3D pressurizing pad 551 according to one embodiment may further include a slit 551e arranged on the middle portion of the pad body 551a and formed to be recessed from the groove portion 551d.

The slit 551e may be formed to be recessed to have a certain size from the rear surface of the pad body 551a where ends of the first inner slope surface ISS1 of the first pressurizing portion 551b and the second inner slope surface ISS2 of the second pressurizing portion 551c meet.

The slit 551e according to one embodiment may have a semi-circular shaped cross-sectional structure of which one side is communicated with the groove portion 551d. For example, the slit 551e may have a curvature radius of 1.5 mm. As shown in the embodiment of FIG. 16, the center of the slit 551e may be arranged at ⅔ height H2 of a height H1 of the 3D pressurizing pad 551 based on the upper surface of the 3D pressurizing pad 551.

The slit 551e may be formed between the first pressurizing portion 551b and the second pressurizing portion 551c overlapped with the middle portion of the pad body 551a in the first direction X to prevent the pressurizing force of the 3D pressurizing pad 551 from being concentrated on any one of the first pressurizing portion 551b and the second pressurizing portion 551c. Also, the slit 551e may provide a space where the ends of the first pressurizing portion 551b and the second pressurizing portion 551c may elastically be deformed, when the 3D pressurizing pad 551 is elastically deformed. In this case, if the slit 551e does not exist between the ends of the first inner slope surface ISS1 and the second inner slope surface ISS2, lifespan of the 3D pressurizing pad 551 may be reduced due to damage of the 3D pressurizing pad 551 resulting from a physical contact or overlap between the ends of the first inner slope surface ISS1 and the second inner slope surface ISS2 when the 3D pressurizing pad 551 is elastically deformed. Optionally, the slit 551e may be expressed as an eccentric prevention member.

Figure 17A:
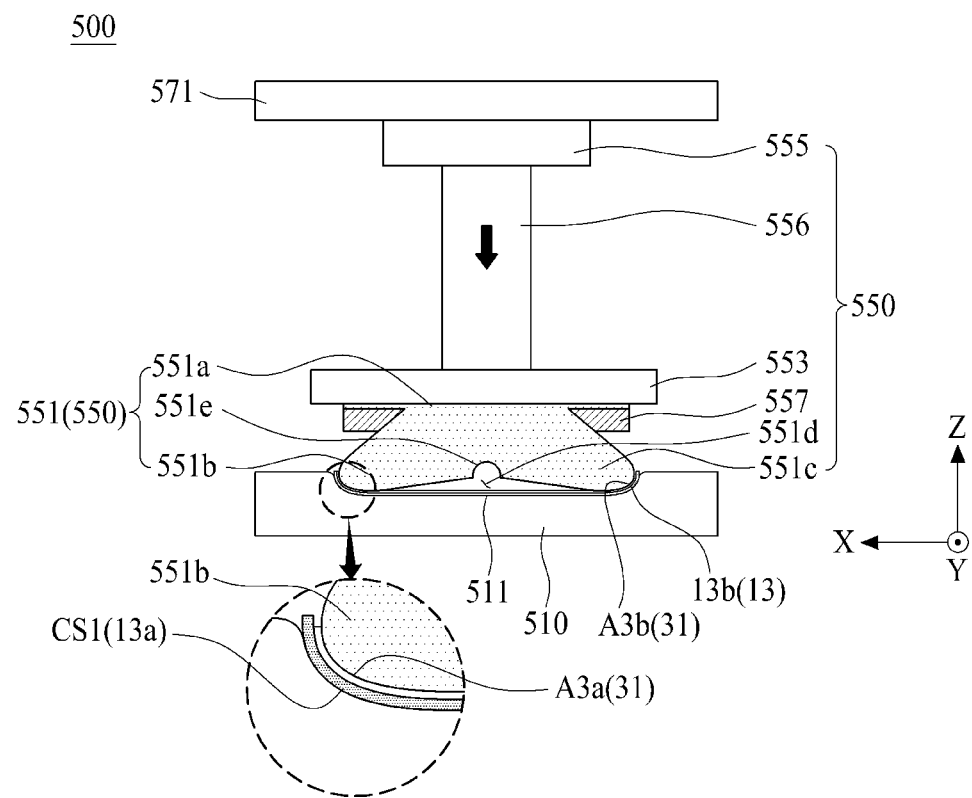
FIGS. 17A and 17B are views illustrating an attachment process of a 3D attachment portion according to other embodiment of the present disclosure, which is shown in FIGS. 15 and 16.
Figure 17B:
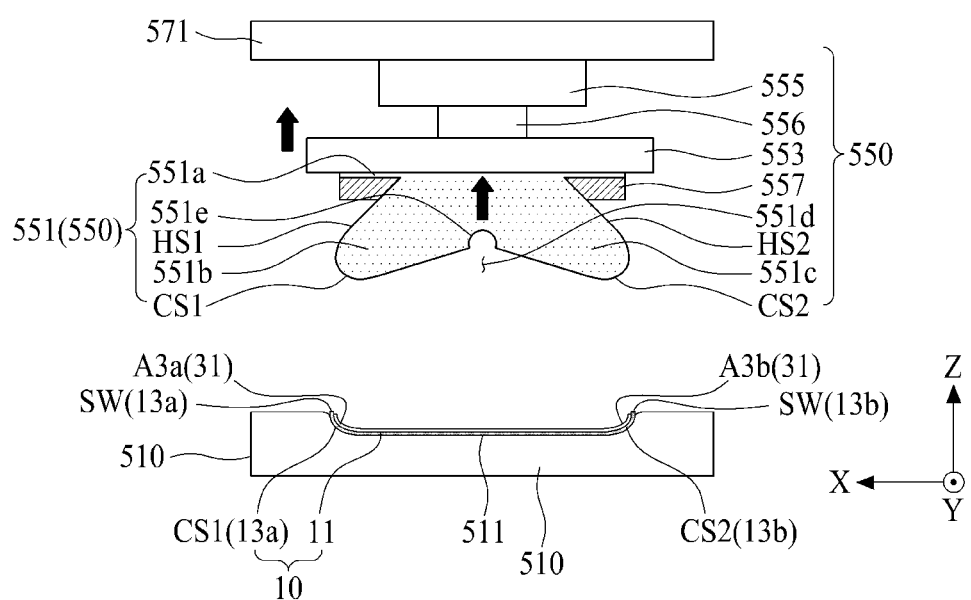

FIGS. 17A and 17B are views illustrating an attachment process of a 3D attachment portion according to other embodiment of the present disclosure, which is shown in FIGS. 15 and 16.

The attachment process of the 3D attachment portion according to other embodiment of the present disclosure will be described with reference to FIGS. 17A and 17B together with FIGS. 15 and 16.

The window supporting member 510 adsorbs and supports the cover window 10 to which the second adhesive surface A2 of the display panel 31 is attached loaded from the third transfer portion TP3.

The third alignment stage 571 is driven to align the position of the 3D pressurizing pad 551 and the position of the cover window 10 supported in the window supporting member 510 by moving the 3D pad lifting unit 555 of the 3D attachment unit 550 in the X-axis direction and/or Y-axis direction.

As shown in FIG. 17A, the 3D attachment unit 550 presses or attaches the edge adhesive surfaces A3a and A3b of the display panel 31 to at least a part of or the entire curved window 13 of the cover window 10 supported in the window supporting member 510 through the 3D pressurizing pad 551 by descending the 3D pad supporting block 553 through driving of the 3D pad lifting unit 555. In this case, the first pressurizing portion 551b of the 3D pressurizing pad 551 may elastically be deformed in accordance with a physical contact with one edge of the display panel 31 overlapped with one edge adhesive surface A3a of the display panel 31 in accordance with descending of the 3D pad supporting block 553. For this reason, the first pressurizing portion 551b may attach one edge adhesive surface A3a of the display panel 31 to the first curvature portion 13a of the curved window 13 by locally pressurizing one edge adhesive surface A3a of the display panel 31. At the same time, the second pressurizing portion 551c of the 3D pressurizing pad 551 may elastically be deformed in accordance with a physical contact with another edge of the display panel 31 overlapped with another edge adhesive surface A3b of the display panel 31 in accordance with descending of the 3D pad supporting block 553. For this reason, the second pressurizing portion 551c may attach another edge adhesive surface A3b of the display panel 31 to the second curvature portion 13b of the curved window 13 by locally pressurizing another edge adhesive surface A3b of the display panel 31. At this time, the first pressurizing portion 551b of the 3D pressurizing pad 551 may elastically be deformed to the same 3D shape as that of the first curvature portion 13a by the groove portion 551d, the slit 551e, and the first outer slope surface OSS1 Likewise, the second pressurizing portion 551c of the 3D pressurizing pad 551 may elastically be deformed to the same 3D shape as that of the second curvature portion 13b by the groove portion 551d, the slit 551e, and the second outer slope surface OSS2. Therefore, the edge adhesive surface A3 of the display panel 31 may be pressed or attached to each of the first curvature portion 13a and the second curvature portion 13b of the curved window 13 by a local pressurizing pressure according to elastic deformation of each of the first pressurizing portion 551b and the second pressurizing portion 551c of the 3D pressurizing pad 551, respectively.

As shown in FIG. 17B, the 3D attachment unit 550 raises the 3D pressurizing pad 551 to the panel unloading position (or home position) by raising the 3D pad supporting block 553 to the home position through driving of the 3D pad lifting unit 555.

The window supporting member 510 releases vacuum adsorption for the cover window 10 bonded to the display panel 31. Therefore, the cover window 10 supported in the window supporting member 510 and bonded to the display panel 31 may be unloaded from the 3D attachment portion 500 by the fourth transfer portion TP4, whereby the display panel 31 and the cover window 10 may be bonded.

The manufacturing apparatus of the flexible display apparatus according to the present disclosure may be described as follows.

The manufacturing apparatus according to one embodiment of the present disclosure is an apparatus configured to bond a display panel to a cover window having a flat portion between a first curvature portion and a second curvature portion, and may comprise a first attachment portion configured to press a first adhesive surface of the display panel to the flat portion of the cover window, and a 3D attachment portion configured to press a first edge adhesive surface and a second edge adhesive surface of the display panel to the first curvature portion and the second curvature portion of the cover window, respectively, and not press the first adhesive surface of the display panel.

According to one embodiment of the present disclosure, the first attachment portion may include a first window supporting stage configured to support the cover window, a panel supporting stage overlapping the first window supporting stage and configured to be loaded with the display panel, and a first attachment unit having a first pressurizing pad configured to press the first adhesive surface of the display panel to the flat portion of the cover window by passing through the panel supporting stage.

According to one embodiment of the present disclosure, the panel supporting stage may include a pad through hole overlapping the first adhesive surface of the display panel, and the first pressurizing pad may press the first adhesive surface of the display panel to the flat portion of the cover window by passing through the pad through hole.

According to one embodiment of the present disclosure, the first attachment portion may further include a film delamination unit configured to delaminate or peel a protective film of an adhesive sheet of the display panel loaded in the panel supporting stage.

According to one embodiment of the present disclosure, further comprising a second attachment portion including a second window supporting stage configured to support the cover window, and a second attachment unit overlapping the second window supporting stage and having a second pressurizing pad configured to press a second adhesive surface of the display panel to the flat portion of the cover window, the second adhesive surface having an area greater than that of the first adhesive surface.

According to one embodiment of the present disclosure, the second pressurizing pad may include a convex panel pressurizing surface.

According to one embodiment of the present disclosure, the 3D attachment portion may include a window supporting member configured to support the cover window, and a 3D attachment unit overlapping the window supporting member and having a 3D pressurizing pad configured to press the first edge adhesive surface and the second edge adhesive surface of the display panel to the first curvature portion and the second curvature portion of the cover window, respectively, and not press the first adhesive surface of the display panel.

A manufacturing apparatus according to one embodiment of the present disclosure is an apparatus configured to bond a display panel to a cover window having a flat portion between a first curvature portion and a second curvature portion, and may comprise a 3D attachment portion configured to press a first the edge adhesive surface and a second edge adhesive surface of the display panel to the first curvature portion and the second curvature portion of the cover window, respectively, and not press a first adhesive surface of the display panel between the first edge adhesive surface and the second edge adhesive surface of the display panel, and the 3D attachment portion may include a window supporting member configured to support the cover window, and a 3D attachment unit overlapping the window supporting member and having a 3D pressurizing pad configured to press the first edge adhesive surface and the second edge adhesive surface of the display panel to the first curvature portion and the second curvature portion of the cover window, respectively, and not press the first adhesive surface of the display panel.

According to one embodiment of the present disclosure, the 3D pressuring pad may include a pad body, a first pressurizing portion protruded from a side of the pad body having a varying thickness and configured to press the first edge adhesive surface of the display panel to the first curvature portion, and a second pressurizing portion protruded from another side of the pad body having varying thickness and configured to press the second edge adhesive surface of the display panel to the second curvature portion.

According to one embodiment of the present disclosure, the 3D pressurizing pad may further include a groove portion between the first pressurizing portion and the second pressurizing portion.

According to one embodiment of the present disclosure, the 3D pressurizing pad may further include a slit arranged on a middle portion of the pad body between the first pressurizing portion and the second pressurizing portion, and formed to be recessed from the groove portion, and a hollow surface formed to be recessed from an outer side of each of the first pressurizing portion and the second pressurizing portion.

According to one embodiment of the present disclosure, the slit may include an arc shape having a first curvature radius, and the hollow surface may include another arc shape having a second curvature radius greater than the first curvature radius.

According to one embodiment of the present disclosure, a center of the hollow surface is aligned with a center of the slit.

According to one embodiment of the present disclosure, the 3D pressurizing pad may further include a slit formed to be recessed from a middle portion of the pad body and connected to each of the first pressurizing portion and the second pressurizing portion.

According to one embodiment of the present disclosure, the first pressurizing portion may include a first convex surface configured to press the first edge adhesive surface of the display panel to the first curvature portion, and a first slope surface between the first convex surface and the slit.

According to one embodiment of the present disclosure, the second pressurizing portion may include a second convex surface configured to press the second edge adhesive surface of the display panel to the second curvature portion, and a second slope surface between the second convex surface and the slit.

According to one embodiment of the present disclosure, the first pressurizing portion may include a first convex surface configured to press the first edge adhesive surface of the display panel to the first curvature portion, a first hollow surface between one side end of the pad body and one end of the first convex surface, and a first slope surface between the other end of the first convex surface and the middle portion of the pad body.

According to one embodiment of the present disclosure, the second pressurizing portion may include a second convex surface configured to press the second edge adhesive surface of the display panel to the second curvature portion, a second hollow surface between the other side end of the pad body and one end of the second convex surface, and a second slope surface between the other end of the second convex surface and the middle portion of the pad body.

According to one embodiment of the present disclosure, the 3D pressurizing pad may further include a slit arranged on the middle portion of the pad body and formed between the first pressurizing portion and the second pressurizing portion, the first slope surface of the first pressurizing portion may be inclined between the other end of the first convex surface and one side of the slit, and the second slope surface of the second pressurizing portion may be inclined between the other end of the second convex surface and the other side of the slit.

According to one embodiment of the present disclosure, the first pressurizing portion may include a first convex surface configured to press the first edge adhesive surface of the display panel to the first curvature portion, a first inner slope surface between the first convex surface and a middle portion of the rear side of the pad body, and a first outer slope surface between an end of the middle portion of the rear side of the pad body and one end of the first convex surface.

According to one embodiment of the present disclosure, the second pressurizing portion may include a second convex surface configured to press the second edge adhesive surface of the display panel to the second curvature portion, a second inner slope surface between the second convex surface and a middle portion of a rear side of the pad body, and a second outer slope surface between the other end of the middle portion of the rear side of the pad body and one end of the second convex surface.

According to one embodiment of the present disclosure, the 3D pressurizing pad may further include a slit arranged on a middle portion of the pad body and formed between the first pressurizing portion and the second pressurizing portion, the first inner slope surface of the first pressurizing portion may be inclined between the other end of the first convex surface and one side of the slit, and the second inner slope surface of the second pressurizing portion may be inclined between the other end of the second convex surface and the other side of the slit.

According to one embodiment of the present disclosure, the 3D pressurizing pad may include an elastic material configured to be at least partially deformed when pressing the display panel.

According to one embodiment of the present disclosure, each of the first and second curvature portions may include a curved portion curved from the flat portion, and a sidewall extended from an end of the curved portion, and an angle between the flat portion and the sidewall may be 60° or more.

The manufacturing apparatus of a flexible display apparatus according to one embodiment of the present disclosure may further comprise a first transfer portion for loading each of the cover window and the display panel in the first attachment portion, a second transfer portion for taking the cover window to which the first adhesive surface of the display panel is attached, out of the first attachment portion and loading the cover window in the second attachment portion, a third transfer portion for taking the cover window to which the second adhesive surface of the display panel is attached, out of the second attachment portion and loading the cover window in the third attachment portion, and a fourth transfer portion for taking the cover window to which the display panel is attached, out of the third attachment portion.

The manufacturing apparatus of a flexible display apparatus according to one embodiment of the present disclosure may further comprise a hardening portion loaded with the curved window to which the display panel is attached, from the fourth transfer portion, hardening the adhesive surface between the display panel and the curved window.

A structure according to one embodiment of the present disclosure may comprise a cover window of which both edges have a shape of a specific angle or more, and at least one layer attached to an inner surface of the cover window without bubbles by an attachment process that does not use a diaphragm.

According to one embodiment of the present disclosure, the at least one layer may be attached to inner surfaces of the both edges by local pressurization of an elastic deformation pad that follows a shape of the both edges.

According to one embodiment of the present disclosure, the specific angle may be 60° or more.

According to one embodiment of the present disclosure, the cover window may have a height of 2.0 mm or more.

According to one embodiment of the present disclosure, the both edges may have a width of 3.0 mm or more.

A display apparatus according to one embodiment of the present disclosure may comprise a substrate having a pixel array portion, and a cover window covering the substrate, wherein both edges of the cover window have a shape of a specific angle or more, and at least one layer may be attached to an inner surface of the cover window.

According to one embodiment of the present disclosure, the at least one layer may be attached to inner surfaces of the both edges without bubbles by an attachment process that does not use a diaphragm.

According to one embodiment of the present disclosure, the specific angle may be 60° or more.

According to one embodiment of the present disclosure, the cover window may have a height of 2.0 mm or more.

According to one embodiment of the present disclosure, the both edges may have a width of 3.0 mm or more.

According to one embodiment of the present disclosure, the at least one layer may be attached to inner surfaces of the both edges by local pressurization of an elastic deformation pad that follows a shape of the both edges.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A manufacturing apparatus configured to bond a display panel to a cover window having a flat portion between a first curvature portion and a second curvature portion, the manufacturing apparatus comprising:
    a first attachment portion configured to press a first adhesive surface of the display panel to the flat portion of the cover window; and
    a 3D attachment portion configured to press a first edge adhesive surface and a second edge adhesive surface of the display panel to the first curvature portion and the second curvature portion of the cover window, respectively, and not press the first adhesive surface of the display panel,
    wherein the 3D attachment portion includes:
        a window supporting member configured to support the cover window; and
        a 3D attachment unit overlapping the window supporting member and having a 3D pressurizing pad configured to press the first edge adhesive surface and the second edge adhesive surface of the display panel to the first curvature portion and the second curvature portion of the cover window, respectively, and not press the first adhesive surface of the display panel,
    wherein the 3D pressurizing pad includes:
        a pad body;
        a first pressurizing portion protruding from a side of the pad body, the first pressurizing portion having varying thickness and configured to press the first edge adhesive surface of the display panel to the first curvature portion; and
        a second pressurizing portion protruding from another side of the pad body, the second pressurizing portion having varying thickness and configured to press the second edge adhesive surface of the display panel to the second curvature portion, and
wherein the 3D pressurizing pad further includes a groove portion between the first pressurizing portion and the second pressurizing portion, and a cross-sectional area of the groove portion is gradually reduced toward the pad body.

2. The manufacturing apparatus of claim 1, wherein the first attachment portion includes:
a first window supporting stage configured to support the cover window;
a panel supporting stage overlapping the first window supporting stage and configured to be loaded with the display panel; and
a first attachment unit having a first pressurizing pad configured to press the first adhesive surface of the display panel to the flat portion of the cover window by passing through the panel supporting stage.

3. The manufacturing apparatus of claim 2, wherein the panel supporting stage includes a pad through hole overlapping the first adhesive surface of the display panel, and the first pressurizing pad presses the first adhesive surface of the display panel to the flat portion of the cover window by passing through the pad through hole.

4. The manufacturing apparatus of claim 2, wherein the first attachment portion further includes a film delamination unit configured to delaminate or peel a protective film of an adhesive sheet of the display panel loaded in the panel supporting stage.

5. The manufacturing apparatus of claim 1, further comprising a second attachment portion, wherein the second attachment portion includes:
a second window supporting stage configured to support the cover window; and
a second attachment unit overlapping the second window supporting stage and having a second pressurizing pad configured to press a second adhesive surface of the display panel to the flat portion of the cover window, the second adhesive surface having an area greater than that of the first adhesive surface.

6. The manufacturing apparatus of claim 5, wherein the second pressurizing pad includes a convex panel pressurizing surface.

7. A manufacturing apparatus configured to bond a display panel to a cover window having a flat portion between a first curvature portion and a second curvature portion, the manufacturing apparatus comprising:
a 3D attachment portion configured to press a first edge adhesive surface and a second edge adhesive surface of the display panel to the first curvature portion and the second curvature portion of the cover window, respectively, and not press a first adhesive surface of the display panel between the first edge adhesive surface and the second edge adhesive surface of the display panel,
wherein the 3D attachment portion includes:
a window supporting member configured to support the cover window; and
a 3D attachment unit overlapping the window supporting member and having a 3D pressurizing pad configured to press the first edge adhesive surface and the second edge adhesive surface of the display panel to the first curvature portion and the second curvature portion of the cover window, respectively, and not press the first adhesive surface of the display panel,
wherein the 3D pressurizing pad includes:
a pad body;
a first pressurizing portion protruding from a side of the pad body, the first pressurizing portion having varying thickness and configured to press the first edge adhesive surface of the display panel to the first curvature portion; and
a second pressurizing portion protruded from another side of the pad body, the second pressurizing portion having varying thickness and configured to press the second edge adhesive surface of the display panel to the second curvature portion, and
wherein the 3D pressurizing pad further includes a groove portion between the first pressurizing portion and the second pressurizing portion, and a cross-sectional area of the groove portion is gradually reduced toward the pad body.

8. The manufacturing apparatus of claim 7, wherein the 3D pressurizing pad further includes:
a slit arranged on a middle portion of the pad body between the first pressurizing portion and the second pressurizing portion, and formed to be recessed from the groove portion; and
a hollow surface formed to be recessed from an outer side of each of the first pressurizing portion and the second pressurizing portion.

9. The manufacturing apparatus of claim 8,
wherein the slit includes an arc shape having a first curvature radius, and
wherein the hollow surface includes another arc shape having a second curvature radius greater than the first curvature radius.

10. The manufacturing apparatus of claim 9, wherein a center of the hollow surface is aligned with a center of the slit.

11. The manufacturing apparatus of claim 7, wherein the 3D pressurizing pad further includes a slit formed to be recessed from a middle portion of the pad body and connected to each of the first pressurizing portion and the second pressurizing portion.

12. The manufacturing apparatus of claim 11, wherein the first pressurizing portion includes:
a first convex surface configured to press the first edge adhesive surface of the display panel to the first curvature portion; and
a first slope surface between the first convex surface and the slit.

13. The manufacturing apparatus of claim 12, wherein the second pressurizing portion includes:
a second convex surface configured to press the second edge adhesive surface of the display panel to the second curvature portion; and
a second slope surface between the second convex surface and the slit.

14. The manufacturing apparatus of claim 7, wherein the first pressurizing portion includes:
a first convex surface configured to press the first edge adhesive surface of the display panel to the first curvature portion;
a first hollow surface between one side end of the pad body and one end of the first convex surface; and
a first slope surface between the other end of the first convex surface and a middle portion of the pad body.

15. The manufacturing apparatus of claim 14, wherein the second pressurizing portion includes:

a second convex surface configured to press the second edge adhesive surface of the display panel to the second curvature portion;

a second hollow surface between the other side end of the pad body and one end of the second convex surface; and a second slope surface between the other end of the second convex surface and the middle portion of the pad body.

16. The manufacturing apparatus of claim 15, wherein the 3D pressurizing pad further includes a slit arranged on the middle portion of the pad body and formed between the first pressurizing portion and the second pressurizing portion, wherein the first slope surface of the first pressurizing portion is inclined between the other end of the first convex surface and one side of the slit, and wherein the second slope surface of the second pressurizing portion is inclined between the other end of the second convex surface and the other side of the slit.

17. The manufacturing apparatus of claim 7, wherein the first pressurizing portion includes:

a first convex surface configured to press the first edge adhesive surface of the display panel to the first curvature portion;

a first inner slope surface between the first convex surface and a middle portion of a rear side of the pad body; and a first outer slope surface between an end of the middle portion of the rear side of the pad body and one end of the first convex surface.

18. The manufacturing apparatus of claim 17, wherein the second pressurizing portion includes:

a second convex surface configured to press the second edge adhesive surface of the display panel to the second curvature portion;

a second inner slope surface between the second convex surface and the middle portion of the rear side of the pad body; and a second outer slope surface between the other end of the middle portion of the rear side of the pad body and one end of the second convex surface.

19. The manufacturing apparatus of claim 18, wherein the 3D pressurizing pad further includes a slit arranged on a middle portion of the pad body and formed between the first pressurizing portion and the second pressurizing portion, wherein the first inner slope surface of the first pressurizing portion is inclined between the other end of the first convex surface and one side of the slit, and wherein the second inner slope surface of the second pressurizing portion is inclined between the other end of the second convex surface and the other side of the slit.

20. The manufacturing apparatus of claim 7, wherein the 3D pressurizing pad includes an elastic material configured to be at least partially deformed when pressing the display panel.

21. The manufacturing apparatus of claim 7, wherein each of the first and second curvature portions includes:

a curved portion curved from the flat portion; and a sidewall extended from an end of the curved portion, and wherein an angle between the flat portion and the sidewall is 60° or more.

* * * * *